United States Patent
Collins

(10) Patent No.: US 6,589,437 B1
(45) Date of Patent: *Jul. 8, 2003

(54) ACTIVE SPECIES CONTROL WITH TIME-MODULATED PLASMA

(75) Inventor: Kenneth S. Collins, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/262,945

(22) Filed: Mar. 5, 1999

(51) Int. Cl.[7] .............................. H01L 21/02; C23F 1/02
(52) U.S. Cl. ............................. 216/68; 216/67; 216/71
(58) Field of Search ................................ 216/67, 68, 71

(56) References Cited

U.S. PATENT DOCUMENTS

| | | | |
|---|---|---|---|
| 4,123,316 A | 10/1978 | Tsuchimoto | 438/731 |
| 4,261,762 A | 4/1981 | King | 438/514 |
| 4,350,578 A | 9/1982 | Frieser et al. | 204/192.35 |
| 4,427,516 A | 1/1984 | Levinstein et al. | 204/192.38 |
| 4,427,762 A | 1/1984 | Takahashi et al. | 430/436 |
| 4,430,547 A | 2/1984 | Yoneda et al. | 219/121.4 |
| 4,457,359 A | 7/1984 | Holden | 165/80.5 |
| 4,512,391 A | 4/1985 | Harra | 294/1.22 |
| 4,565,601 A | 1/1986 | Kakehi et al. | 216/59 |
| 4,711,698 A | 12/1987 | Douglas | 438/722 |
| 4,755,345 A | 7/1988 | Baity, Jr. et al. | 376/123 |
| 4,756,810 A | 7/1988 | Lamont, Jr. et al. | 204/192.3 |
| 4,786,352 A | 11/1988 | Benzing | 156/345 |
| 4,786,359 A | 11/1988 | Stark et al. | 438/710 |
| 4,793,897 A | 12/1988 | Dunfield et al. | 438/724 |
| 4,807,016 A | 2/1989 | Douglas | 257/774 |
| 4,810,935 A | 3/1989 | Boswell | 315/111.41 |
| 4,842,683 A | 6/1989 | Cheng et al. | 156/345 |
| 4,870,245 A | 9/1989 | Price et al. | 219/121.36 |
| 4,918,031 A | 4/1990 | Flamm et al. | 438/695 |
| 4,948,458 A | 8/1990 | Ogle | 126/628 |
| 4,948,750 A | 8/1990 | Kausche et al. | 438/485 |
| 4,990,229 A | 2/1991 | Campbell et al. | 204/298.06 |
| 5,000,113 A | 3/1991 | Wang et al. | 118/723 E |
| 5,006,220 A | 4/1991 | Hijikata et al. | 204/298.33 |
| 5,015,330 A | 5/1991 | Okumura et al. | 438/694 |
| 5,074,456 A | 12/1991 | Degner et al. | 228/121 |
| 5,085,727 A | 2/1992 | Steger | 156/345 |
| 5,169,487 A | 12/1992 | Langley et al. | 438/714 |

(List continued on next page.)

FOREIGN PATENT DOCUMENTS

| | | |
|---|---|---|
| EP | 0 403 418 A2 | 12/1990 |
| EP | 0 413 282 A2 | 2/1991 |
| EP | 0 520 519 A1 | 12/1992 |

(List continued on next page.)

OTHER PUBLICATIONS

Coburn, W.J., "Increasing the Etch Rate Ratio oSiO2/Si in Fluorocarbon Plasma Etching," *IBM Technical Disclosure*, vol. 19, No. 10, Mar. 1977.

(List continued on next page.)

*Primary Examiner*—Rodney G. McDonald
(74) *Attorney, Agent, or Firm*—Robert Wallace; Joseph Bach

(57) ABSTRACT

A method and an apparatus for actively controlling the density of the species generated in a plasma reactor using time-modulation. The method of the present invention includes providing an inductively coupled plasma reactor, irradiating a process gas and time-modulating an energy emission from the RF applicator in order to achieve a desired density of species within a plasma. The time-modulation includes varying an on-time and an off-time of the modulating signal. Moreover, a short on-time and a longer off-time is preferred if the degree of dissociation is to be minimized. The apparatus of the present invention, in which the above method may be carried out, includes an all-semiconductor chamber having a signal modulator. Moreover, the apparatus includes a reactor having various embodiments of a solenoidal antenna and a signal modulator.

90 Claims, 25 Drawing Sheets

U.S. PATENT DOCUMENTS

| | | | |
|---|---|---|---|
| 5,187,454 A | 2/1993 | Collins et al. | 333/17.3 |
| 5,203,956 A | 4/1993 | Hansen | 216/63 |
| 5,241,245 A | 8/1993 | Barnes et al. | 315/111.41 |
| 5,249,251 A | 9/1993 | Egalon et al. | 385/123 |
| 5,258,824 A | 11/1993 | Carlson et al. | 356/382 |
| 5,276,693 A | 1/1994 | Long et al. | 372/6 |
| 5,277,751 A | 1/1994 | Ogle | 216/70 |
| 5,326,404 A | 7/1994 | Sato | 118/723 MR |
| 5,346,578 A | 9/1994 | Benzing et al. | 156/345 |
| 5,349,313 A | 9/1994 | Collins et al. | 333/131 |
| 5,392,018 A | 2/1995 | Collins et al. | 336/155 |
| 5,399,237 A | 3/1995 | Keswick et al. | 216/68 |
| 5,401,350 A | 3/1995 | Patrick et al. | 156/345 |
| 5,414,246 A | 5/1995 | Shapona | 219/640 |
| 5,421,891 A | 6/1995 | Campbell et al. | 118/723 R |
| 5,423,945 A | 6/1995 | Marks et al. | 438/695 |
| 5,468,341 A | 11/1995 | Samukawa | 216/69 |
| 5,477,975 A | 12/1995 | Rice et al. | 216/68 |
| 5,514,246 A | 5/1996 | Blalock | 438/694 |
| 5,529,657 A | 6/1996 | Ishii | 156/345 |
| 5,556,501 A | 9/1996 | Collins et al. | 156/345 |
| 5,683,538 A * | 11/1997 | O'Neill et al. | 156/345 |
| 5,779,925 A * | 7/1998 | Hashimoto et al. | 216/67 |
| 5,928,528 A * | 7/1999 | Kubota et al. | 216/67 |
| 5,935,373 A | 8/1999 | Koshimizu | 156/345 |
| 6,074,512 A * | 6/2000 | Collins et al. | 156/345 |
| 6,255,221 B1 * | 7/2001 | Hudson et al. | 438/710 |

FOREIGN PATENT DOCUMENTS

| | | |
|---|---|---|
| EP | 0 552 490 A1 | 7/1993 |
| EP | 0 552 491 A1 | 7/1993 |
| EP | 0 601 468 A1 | 6/1994 |
| EP | 0 651 434 A2 | 5/1995 |
| EP | 0 680 072 A2 | 11/1995 |
| EP | 0 727 807 A1 | 8/1996 |
| EP | 0 742 577 A2 | 11/1996 |
| EP | 0 837 489 A2 | 4/1998 |
| EP | 0 892 422 A2 | 1/1999 |
| JP | 55-154582 | 12/1980 |
| JP | 57-155732 | 9/1982 |
| JP | 61-147531 | 12/1984 |
| JP | 61-91377 | 5/1986 |
| JP | 61-142744 | 6/1986 |
| JP | 62-12129 | 1/1987 |
| JP | 62-254428 | 11/1987 |
| JP | 63-9120 | 1/1988 |
| JP | 02-312227 | * 12/1990 |
| JP | 8-45903 | * 2/1996 |
| WO | WO 92/20833 | 11/1992 |

OTHER PUBLICATIONS

Matsuo, Seitaro, "Selective Etching of SiO2 Relative to Si by Plasma Reactive Sputter Etching," *J. Vac. Sc. Technology*, vol. 17, No. 2. Mar.–Apr. 1980.

Lee, Ho–Jun, Yang, Dong–II and Whang, Ki–Woong, "The effects of magnetic fields on a planar inductively coupled argon plasma," *Plasma Sources Sci. Technol.*, 5(1996), pp. 383–388.

Sugai, H. and Nakamura, K., "Diagnostics and Control of radicals in an inductively coupled etching reactor," *J. Vac. Sci. Technol.*, A 13(3), May/Jun. 1995, pp. 887–893.

Horiike, Yashuiro, Kubata, Kazuhiro, Shindo, Haruo and Kukasawa, Takayuki, "High rate and highly selective SiO2 etching employing inductively coupled plasma and discussion on reaction kinetics," *J. Vac. Sci. Technol.*, A 13(3), May/Jun. 1995, pp. 801–809.

Lieberman, M.A. and Ashida, S., "Global models of pulse–power–modulated high–density, low pressure discharges," *Plasma Sources Sci. Technol.*, 5(1996), pp. 145–158.

Samukawa, Seiji and Ohtake, Hiroto, "Pulse–time Modulated Plasma Etching for Precise ULSI Patterning," Abstract No. 162, *Microelectronics Research Laboratories*, NEC Corporation, Japan, May 1996, pp. 217–218.

Shibano, Teruo, Fujiwara, Nobuo, Hirayama, Makoto, Nagata, Hitoshi and Demizo, Kiyoshi, "Etching yields of SiO2 by low energy CF+x and Fx ions," *Appl. Phys. Lett.*, vol. 63, No. 17, Oct. 225, 1993.

Tynan, G.R., Bailey, A.D. III, Campbell, G.A., Charatan, R., de Chambrier, A., Gibson, G., "Characterization of an Azimuthally Symmetric Helicon Wave High Density Plasma Source," *Trikon Technologies, Inc.*, Japan, Jul. 1997.

European Patent Office Communication Pursuant to Article 96(2) and Rule 51(2) EPC for Application No. 94307307.2–2208, mailed Jan. , 1996.

Patent Abstracts of Japan, Publication No. 57045927 A, Mar. 16, 1982 (Fujitsu Ltd).

Patent Abstracts of Japan, Publication No. 06196446 A, Jul. 15, 1994 (NEC Corp).

Patent Abstracts of Japan, Publication No. 07288196 A, Oct. 31, 1995 (Tokyo Electron Ltd).

Patent Abstracts of Japan, Publication No. 08017799 A, Jan. 19, 1996 (Plasma Syst: KK).

Patent Abstracts of Japan, Publication No. 62052714 A, Mar. 7, 1987 (Olympus Optical Co. Ltd; Toagosei Chem Ind Co Ltd).

Patent Abstracts of Japan, Publication No. 410079372, Mar. 24, 1998, (Matsushita Electric Ind Co Ltd).

Patent Abstracts of Japan, Publication No. 11026433, Apr. 30, 1999, Matsushita Electron Corp).

* cited by examiner

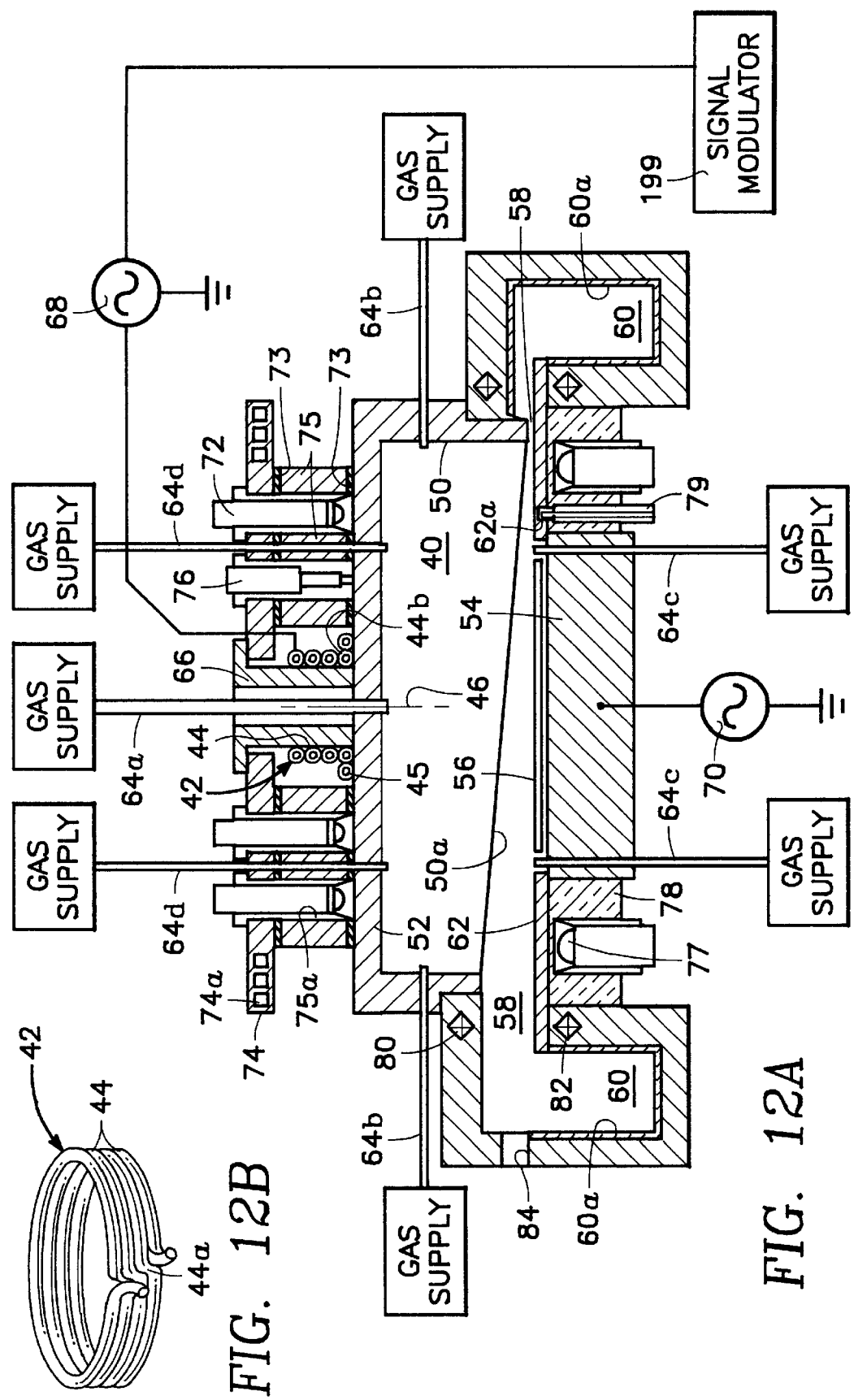

ACTIVE SPECIES CONTROL WITH TIME-MODULATED PLASMA

CROSS-REFERENCE TO RELATED APPLICATIONS

The following co-pending U.S. applications disclose related subject matter and their entire disclosures are hereby incorporated by reference:

(a) Ser. No. 09/049,722 filed Mar. 27, 1998 by Dimitris P. Lymberopoulos et al. entitled "Method and Apparatus for Improving Processing and Reducing Charge Damage in an Inductively Coupled Plasma Reactor" now U.S. Pat. No. 6,085,688;

(b) Ser. No. 08/648,254 filed May 13, 1996 by Kenneth S. Collins et al. entitled "Inductively Coupled RF Plasma Reactor Having an Overhead Solenoidal Antenna" now U.S. Pat. No. 6,165,311, which is a continuation-in-part of the following U.S. applications:

(1) Ser. No. 08/580,026 filed Dec. 20, 1995, by Kenneth S. Collins et al., which is a continuation of Ser. No. 08/041,796 filed Apr. 1, 1993 now U.S. Pat. No. 5,556,501, which is a continuation of Ser. No. 07/722,340 filed Jun. 27, 1991 now abandoned;

(2) Ser. No. 08/503,467 filed Jul. 18, 1995 by Michael Rice et al. now U.S. Pat. No. 5,770,094, which is a divisional of Ser. No. 08/138,060 filed Oct. 15, 1993 now U.S. Pat. No. 5,447,975; and (3) Ser. No. 08/597,577 filed Feb. 2, 1996 by Kenneth S. Collins now U.S. Pat. No. 6,077,384, which is a continuation-in-part of Ser. No. 08/521,668 filed Aug. 31, 1995 (now abandoned), which is a continuation-in-part of Ser. No. 08/289,336 filed Aug. 11, 1994 now abandoned, which is a continuation of Ser. No. 07/984,045 filed Dec. 1, 1992 (now abandoned);

(C) Ser. No. 08/648,256 filed May 13, 1996 by Kenneth S. Collins et al. entitled "Plasma Reactor with Heated Source of a Polymer-Hardening Precursor Material" now U.S. Pat. No. 6,036,877.

BACKGROUND OF THE INVENTION

1. Field of the Invention

The present invention relates in general to plasma reactors having an RF applicator and more particularly to a method and an apparatus for actively controlling the density of the species generated within such a plasma reactor using time-modulation.

2. Background Art

Plasma (or "dry") etch processing is vitally important to several of the largest manufacturing industries in the world. In particular, plasma etch processing is indispensable in the manufacture of semiconductors, integrated circuits and microelectronic devices. These products are essential to numerous industries including the computer, electronics, biomedical and aerospace industries.

Plasma etch processing is used to modify the surface properties of a workpiece. For example, in semiconductor fabrication the workpiece is a semiconductor wafer and the plasma etch process removes patterned material from the surface of the wafer. Etch requirements such as etch depth may vary between wafers depending on, for example, the hole depth. Thus, a wafer having one pattern usually has different etch requirements than another wafer having another pattern.

These differing etch requirements dictate that such processing parameters as process gas chemistry, temperature, pressure, flow rates and power also differ between etch processes. Moreover, these processing parameters for each etch process are usually precise. Accordingly, each etch process typically has a narrow process window. In fact, several specialized "recipes" of processing parameters exist for etch process, but determining these recipes can consume a great deal of time and cost. Therefore, there is a need to broaden these narrow process windows.

One reason these process windows are so narrow is because of competing etch and deposition mechanisms within the plasma. A process window is bounded by inadequate etch selectivity at one extreme and inadequate etch stop depth at the other extreme. At one extreme, the etch selectivity means that the etch process removes one type of material while leaving other materials unaffected. This selectivity may be to any material, such as selectivity to the photoresist or the underlying substrate. The etch selectivity is inadequate when surfaces that are not meant to be etched are etched. Moreover, inadequate etch selectivity may cause overetching of a hole depth or pattern and reduce yield.

Etch selectivity is often enhanced by introducing polymer precursors in the process gas. In general, a polymer precursor is contained within the process gas and the polymer is deposited on any surface where there is no oxygen coming off the surface. Conversely, when oxygen is coming off the surface, the oxygen tends to prevent a net deposition of polymer. Thus, the polymer deposits on the surfaces of non-oxygen containing materials and not on the surfaces of oxygen containing materials.

At the other extreme the process window is bounded by excessive deposition, or inadequate etch stop depth. If too much polymer precursor is permitted to deposit on the surface of non-oxygen materials, polymer deposition can occur on top of an oxygen-containing material and then etch stop occurs. Etch stop is the cessation of etching prior to the full etching, and usually occurs during the etching of holes in the workpiece due to an excess deposit of polymer in the hole. The depth at which the etch stop occurs is called the etch stop depth. Inadequate etch stop depth means that the etch stop depth is always less than the desired etch depth.

Between these two extremes the etch process has adequate etch selectivity and adequate etch stop depth. In other words, the workpiece has an adequate layer of polymer on the non-oxygen containing surface so that the surface is sufficiently protected from etching and there is a sufficient etch rate to etch the workpiece to a desired depth. However, because a process window is so narrow it is easy to diverge from the window. Too little polymer and inadequate etch selectivity occurs. Too much polymer deposition and inadequate etch stop depth occurs.

One example of an etch process with a narrow process window is a self-aligned contact (SAC) etch process. Typically, a photoresist mask is placed over an oxide layer to be etched. The oxide may be BPSG, undoped silicate glass (USG) or some other oxide and may have various layers of varying oxide materials. Furthermore, there is a silicon substrate with a bottom nitride layer overlying the substrate in order to isolate a poly line conductor from the substrate. The poly line is placed over the insulated substrate and capped with an insulating nitride layer. In addition, there may be various other layers over the poly line. The thickness of the nitride layer overlying the poly line can be as thin as 400 angstroms, while the overall thickness of the poly line insulating layer can be from less than 1 micron to 2 microns.

The SAC etch process requires that a hole be etched into the oxide layer down to the substrate. However, as the hole nears the substrate the poly line may occupy a part of the hole. The poly line insulating layer, including the nitride layer and possibly other materials and layers, are an etch stop layer. The purpose of this etch stop layer is to keep the etchant from "blowing through" and exposing the poly line conductor. Later, a conductive material will be deposited within the hole and contact must be made with the substrate but not the poly line.

The nitride layer over the poly line must be protected with polymer to prevent etching, but the oxide must not be protected because it needs to be etched. in order to accomplish this, the processing parameters call for a relatively low source power and process gas flow. For example, for a process gas of $C_4F_8$, the flow rate is between 12 and 14 standard cubic centimeters per minute (SCCM). The size of the process window is a mere 1 SCCM. If the flow is increased by 2 SCCM etch stop will occur, and if the flow is decreased by 2 SCCM excessive etching will occur. Thus, the process window is so narrow that a change in the gas flow rate of less than about 10% and only 1 SCCM will put the gas flow rate out of the process window.

Another example of an etch process with a narrow process window is a high-aspect ratio etch process. In a high-aspect ratio etch process the aspect ratio, or ratio of the hole depth to the hole diameter, is large. in general, the greatest aspect ratio achievable with current technology is between 5:1 and 6:1 because etch stop tends to occur at higher aspect ratios.

For example, if the process gas contains polymer precursors (e.g., fluorocarbons and fluorohydrocarbons) and the chemistry is "leaned up" so that there is a lower carbon (C) to fluorine (F) ratio, this tends to form less polymer. This means that a deeper hole and higher aspect ratio hole should be able to be etched into the workpiece. The problem, however, is that at higher aspect ratios the photo-resist mask will be erode and lead to "blowing out" of the hole.

If, to avoid this problem, the process gas chemistry is made more "rich" by increasing the flow and putting in more carbon rich chemistry and higher pressures, then a thin polymer layer is formed on the photo-resist. This permits better passivation of the photo-resist. However, more polymer is also deposited in the hole and at some point this excessive deposition of polymer will cause the hole to taper off and etch stop. Typically, if the source power is 10–20% too low etch stop will occur, and if the power is 10–20% too high the etch selectivity will be severely degraded. This narrow process window also applies to other process parameters such as gas flow rate and pressure.

In order to broaden these process windows, an inductively coupled plasma (ICP) reactor or a capacitively coupled plasma (CCP) reactor is often used. In general, the common elements of the two types of plasma reactors include a reactor chamber and a workpiece support within the chamber. The workpiece is placed on the support and a process gas is introduced into the chamber. A plasma is created by irradiating the process gas with an energy emission, such as from an electromagnetic energy source using an RF applicator (for example, an inductive RF antenna), to ignite and sustain the plasma within the reactor chamber. This energy emission breaks downs or dissociates the process gas into several chemically reactive species. Moreover, some of these species are ionized, giving them a net electric charge, which renders them maneuverable in the chamber by an electric field from a bias signal applied to the workpiece. This maneuverability allows, for example, a nearly perfect vertical etch on the workpiece by having the fragments impact the surface of the workpiece at a perpendicular angle.

Typically, an ICP reactor is employed when a high etch rate plasma is required. This is because the ICP reactor generally has a higher ion density and thus a higher etch rate. In general, however, etch selectively is degraded at higher etch rates. Thus, although an ICP reactor tends to have higher plasma density and higher etch rates, the etch selectivity tends to be better in a capacitively coupled reactor. Further, although a CCP reactor usually has better etch selectivity the plasma density and etch rates tend to be much lower than an ICP reactor.

One reason for the difference in etch selectivity between inductively coupled and capacitively coupled reactors is the amount of dissociation within the plasma. In particular, the plasma of an ICP reactor typically has more dissociation that a CCP reactor. Dissociation means that the molecules of the process gas are separated into two or more of the constituent parts of the molecules, generally by inelastic collisions with electrons. These constituent parts, or species, formed as a result of the dissociation, may contain atoms, ions or radicals. Depending on several processing parameters including the chemistry of the process gas, the source power and the chamber pressure, the species formed may be a bigger species or a smaller species. in general, a bigger species means that the species is a less-dissociated species and a smaller species means that the species is a more highly-dissociated species.

As mentioned above the plasma of inductively coupled and capacitively coupled plasma reactors dissociate differently. Specifically, in an ICP reactor the plasma tends to dissociate into relatively small species. Further, these small species can have an adverse effect on selectivity. For example, free fluorine (F) is a small species that is usually undesirable because it tends to etch most any material and thus degrades etch selectivity. On the other hand, the plasma in a CCP reactor tends to dissociate into bigger species. Generally, therefore, in a CCP reactor there is a larger density of bigger species and in an ICP reactor there is a larger density of smaller species. This is one reason why etch selectivity is usually better in a CCP reactor.

For example, in an ICP reactor with a process gas of $CHF_3$, the irradiated process gas dissociates into several species including C, CH, F, $C_2$, CF, CHF, $CF_2$ and $CHF_2$. The bigger, or less-dissociated species include CHF, $CF_2$ and $CHF_2$, while the smaller, or highly-dissociated species include C, F, CH, CF and $C_2$. Thus, the bigger species more resemble the molecular structure of the process gas and the smaller species more resemble the atomic constituents of the gas.

FIG. 1A illustrates the breakdown for the $CHF_3$ process gas in an inductively coupled reactor. The largest percentage (46%) was a relatively small species CF, the second largest percentage (38%) was a relatively big species $CHF_2$, the remainder being 7% C, 6% $CF_2$ and 3% miscellaneous species. The ratio, $CHF_2/CF=0.83$, represents the ratio of bigger species to smaller species. Thus, the smaller species, CF, is the dominant species.

In fact, when the process gas is a fluorocarbon in an inductively coupled plasma reactor, such as $CF_4$, $C_2F_6$ or $C_4F_8$, all dissociate so that CF is usually the dominant species. Although the amounts of free F and other species do change slightly, the ratios of the bigger species to smaller species changes very little. Therefore, what is needed is a method and an apparatus for actively controlling the density of the bigger species and smaller species generated within the plasma so that the ratio of the two can be increased or decreased. Of course, the atomic composition of the process gas will limit the species that can be generated, but controlling the densities of each species would affect the ratio. Increasing the ratio would tend to give better etch selectivity and decreasing the ratio would give better etch stop depth.

Several approaches for controlling the density of species generated within the plasma have been tried in an attempt to broaden the process window, but with only limited success. For example, although changing the chemistry of the process gas has yielded minor success, there have been no major breakthroughs. Further, adjusting other processing parameters such as the source power, bias power and bias frequency have shifted operating points but have not drastically broadened the process window.

One promising technique is to pulse or time-modulate the plasma. in this specification time-modulation and pulsing will be used interchangeably. FIG. 1B illustrates the dissociation of a $CHF_3$ process gas under the same conditions as FIG. 1A, except that FIG. 1A is a continuous wave (CW), or unpulsed, plasma and FIG. 1B is a time-modulated, or pulsed, plasma. The source power was pulsed at 10 microseconds on and 10 microseconds off. The major species was $CHF_2$ (62%), the next major species was CF (25%), with the remainder C (8%), $CF_2$ (4%) and miscellaneous other species (1%). Moreover, the ratio of bigger species to smaller species, or $CHF_2/CF=2.48$, has been increased dramatically.

Several approaches have been proposed regarding plasma pulsing. A majority of these approaches use capacitive coupled reactors. As stated earlier, one problem with capacitively coupled reactors is that they do not have the etch rate of an inductively coupled reactor. Consequently, a CCP reactor has the disadvantage that it cannot etch as deep or fast as an ICP reactor.

Other pulsing approaches use an inductively coupled reactor or a capacitively coupled reactor with a high antenna-to-wafer gap. One problem, however, with a high antenna-to-wafer gap is that the plasma density is degraded. This, in turn, degrades the etch rate. In addition, most approaches use reactors having chamber walls made of metal. Metal walls, however, tend to contaminate the plasma when the plasma comes in contact with the metal.

Accordingly, what is needed is a method and an apparatus for actively controlling the species generated within a plasma. Moreover, it is desirable that the method and apparatus have a high plasma density and etch rate associated with an ICP reactor and a high etch selectivity associated with a CCP reactor. Such a method and an apparatus would permit relatively deep holes to be etched in the workpiece and reduce workpiece processing time.

What is further needed is a method and an apparatus that will broaden the narrow process windows of etch processes such as SAC and high aspect ratio etch processes. Specifically, the method and the apparatus would permit active control of the density of species generated within a plasma so that the etch selectivity would be decoupled from the etch stop depth. This would allow both the etch selectivity and etch stop depth to be increased rather than one increasing while the other decreases. A broader process window would save cost and time on plasma etch processing and make the process easier to use.

What is further needed is a method and an apparatus that would allow control over the density of the species generated within the plasma such that the density of the species and the dissociation could be varied from that of a capacitively coupled reactor to that of an inductively coupled reactor. This would permit the user to selected a specific etch selectivity. For example, in the SAC etch process discussed above the etch selectivity would be high at the initial stages of the hole etch but be gradually increased as the depth of the hole increased. Thus, etch stop could be avoided as well as any delays and shut-downs associated with the need to change the processing parameters.

In addition, what is further needed is a method and an apparatus for controlling the density of species generated within a plasma wherein the reactor has a small antenna-to-workpiece gap. This reduced gap would enhance the plasma density at the surface of the workpiece. Moreover, what is needed is a method and an apparatus whereby the reactor chamber has non-metallic walls. This would eliminate contamination of the plasma due to metal interaction with the plasma.

Whatever the merits of existing methods and plasma reactors for actively controlling the species generated in a plasma, they do not achieve the benefits of the present invention.

SUMMARY OF THE INVENTION

To overcome the limitations in the prior art as described above and other limitations that will become apparent upon reading and understanding the present specification, the present invention includes method and an apparatus for actively controlling the density of the species generated in a plasma reactor using time-modulation.

The method and apparatus of the present invention permit control over the dissociation of the process gas by actively controlling the density of species generated within a plasma. In particular, the present invention uses time-modulation, or pulsing, to achieve this control without sacrificing adequate etch stop, plasma density or etch rate. Moreover, control over the density of the species generated allows the user to select an etch selectivity ranging from that of a capacitively coupled reactor to that of an inductively coupled reactor. This invention decouples the competing mechanisms of etch selectivity and etch stop depth and broadens the process window of several types of etch processes. Thus, the present invention can reduce processing time and increase yield and etch accuracy over existing techniques.

In a preferred embodiment, the present invention includes an apparatus having a non-metallic reactor chamber. In particular, the reactor has a reactor chamber including an interior surface and walls made of a non-metallic material. Further, the reactor has a workpiece support for holding a workpiece within the reactor chamber, a ceiling above the workpiece support and a RF applicator that couples power from a power source into the reactor chamber. A signal modulator can be coupled to the power source, a bias source, or both and provides a means for modulation.

A method of the present invention includes a method of processing a workpiece in this reactor. The method further includes generating a plasma within the reactor chamber by irradiating a process gas with an energy emission from the RF applicator. In addition, the method includes modulating the energy emission to control the density of the species generated within the plasma.

Another preferred embodiment includes a reactor having solenoidal inductive antenna. The reactor includes a reactor chamber, a workpiece support having a support plane, a reactor enclosure and a non-planar inductive antenna next to the reactor enclosure. The non-planar inductive antenna includes inductive elements that are spatially distributed in a non-planar manner relative to the support plane. Moreover, the reactor includes a signal modulator for coupling to a power source, a bias source or both, as a modulation means.

A method of this invention includes providing a reactor having a solenoidal inductive antenna. Moreover, the method includes generating a plasma by irradiating a process gas with an energy emission from the non-planar inductive antenna. The method further includes modulating the energy emission so as to control the density of the species generated within the plasma. Preferably, control of the species is accomplished by varying the on-time and the off-time of the modulation.

Other aspects and advantages of the present invention as well as a more complete understanding thereof will become apparent from the following detailed description, taken in conjunction with the accompanying drawings, illustrating by way of example the principles of the invention. Moreover, it is intended that the scope of the invention be limited by the claims and not the preceding summary or the following detailed description.

BRIEF DESCRIPTION OF THE DRAWINGS

Referring now to the drawings in which like reference numbers represent corresponding parts throughout:

FIG. 12A is a cut-away side view of a plasma reactor in accordance with a plasma reactor of the invention employing a single three-dimensional center non-planar solenoid winding.

FIG. 12B is an enlarged view of a portion of the reactor of FIG. 12A illustrating a preferred way of winding the solenoidal winding.

DETAILED DESCRIPTION OF THE PREFERRED EMBODIMENT

Figure 1A:
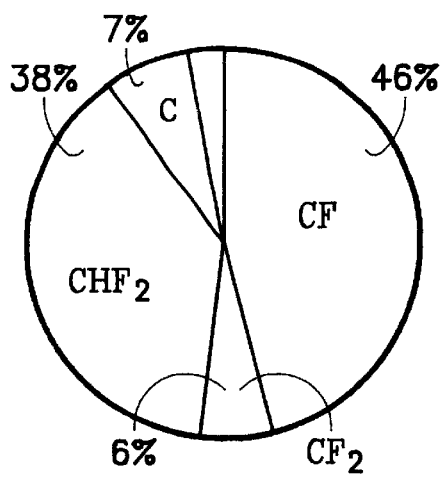
FIG. 1A illustrates the distribution of dissociated species within an unpulsed reactor.

In the following detailed description of the preferred embodiment, reference is made to the accompanying drawings in which is shown by way of illustration a specific embodiment whereby the invention may be practiced. It is to be understood that other embodiments may be utilized and structural and functional changes may be made without departing from the scope of the present invention.

I. Introduction

As shown in the drawings for purposes of illustration, the present invention is embodied in a method and apparatus for actively controlling the density of the species generated in a plasma reactor by using time-modulation. The method includes adjusting the on-time and the off-time of a modulating signal so that an energy emission of an inductive antenna is time-modulated. This modulation varies the amount of dissociation in the plasma from that of a capacitively coupled reactor to a CW inductively coupled reactor. Further, the present invention relates to an apparatus that utilizes this method in an inductively coupled reactor.

The present invention has several advantages over the existing art. some of these advantages are, first, that time-modulation essentially decouples the dissociation of the plasma from the plasma density. Thus, it is possible to vary the amount of dissociation (by varying the density of the species within the plasma) while keeping the plasma density and etch rate high. Moreover, by decoupling the dissociation and plasma density from one another the process window is broadened. This broader process window reduce both the time and the cost of plasma etch processing.

Second, the present invention has the etch rate and plasma density of an inductively coupled reactor and the high etch selectivity of a capacitively coupled reactor. In other words, the present invention incorporates the best features of both types of reactors into a single reactor. Third, the present invention allows an etch selectivity to be selected by the user by controlling the amount of dissociation within the plasma. In particular, by controlling the ratio of bigger species to smaller species the amount of etch selectivity can be determined.

Finally, various embodiments of the present invention include a small antenna-to-workpiece gap, a reactor chamber with a non-metallic reactor chamber and a reactor with a solenoidal antenna. These various embodiments provide a uniform plasma distribution at the workpiece and enhance plasma etch processing performance. Conversely, existing pulsed plasma reactors suffer from several disadvantages including low plasma density, contamination of the plasma due to interaction with metallic surfaces within the reactor chamber and a non-uniform plasma density distribution across the workpiece.

As mentioned above, the method and apparatus of the present invention help to decouple dissociation of the plasma from the plasma density. In other words, the dissociation of the plasma can be decreased without any significant degradation in plasma density. Moreover, the narrow process window inherent in several types of etch processes is markedly broadened. By decoupling the dissociation of the plasma from the plasma density the bounds between adequate etch selectivity and adequate etch stop depth are widened.

Typically, dissociation of a plasma is inexorably coupled to plasma density. For example, a CCP reactor achieves low dissociation but also has a low etch rate and plasma density. On the other hand, an ICP reactor has high dissociation but a high etch rate and plasma density. Thus, the dissociation in the ICP reactor cannot be changed any appreciable amount without adversely affecting the plasma density and etch rate.

A. Efficacy of a Time-Modulated Plasma

In order to investigate the efficacy of time-modulating the plasma, tests were conducted in a test reactor using various process gases. The test reactor was an ICP reactor with a 25 centimeter diameter antenna driven at a fixed frequency of 2.02 MHz. A 5 KW, 1.8–2.2. MHz ENI solid-state RF power generator was operated as an amplifier and driven by a Wavetek RF signal generator. The RF signal generator was operated at 100% amplitude modulation with an externally supplied modulating signal. This modulating signal was a 50% duty cycle square pulse wave supplied by a LeCroy signal generator, with the level deliberately selected to saturate the AM input to the RF signal generator. The modulated RF output of the ENI power generator was applied (via a 50 ohm Z0 transmission line) to the standard, fixed "local matching network" of the plasma source. Antenna current was monitored using a Pearson current transformer on the antenna input. Bias power from a commercial RF generator was applied by an impedance match network to the ceramic ESC. Bias power was used in all test runs to provide some increased plasma potential with respect to ground, which made ion measurements far more consistent than with source only operation. Power measurements were made using the internal meters on the ENI RF power generator. In CW (unpulsed) and pulse mode, the difference between forward and reflected power readings appears to indicate (time average) net power, based on antenna current measurements.

The bulk plasma was sampled using a Hiden Mass/Energy analyzer that permits mass selection or energy selection with or without an internal ionization source. The Hiden analyzer was used in a positive ion mode (no internal source of ionization). The analyzer is differentially turbo-pumped to allow operation over several tens of millitorr pressure in the process region. In addition, the analyzer is electrically grounded, so that it measures ion energies from the bulk plasma, not at the RF biased electrode.

1. Dissociation of Various Process Gases in an ICP Reactor

In FIGS. 1–8 the integrated ion energy distributions for each of the mass-selected species in an ICP reactor are illustrated. The distributions are integrated, meaning that the area under the curve of energy versus flux is summed up for each species. Moreover, FIGS. 1–8 had in common the following conditions: (1) 100 cc of the process gas at a pressure of 10 mtorr; and (2) an average source power of 1000 W with a bias power of 150 W.

Referring again to FIG. 1A, the process gas is $CHF_3$, and the CW (non-pulsed) plasma dissociated into various species. Specifically, 38% of the species were $CHF_2$, a bigger (less-dissociated) species. Further, 46% of the species were CF, a smaller (more-dissociated species). The rest of the species were much smaller densities of species including 7% C and 6% $CF_2$.

Figure 1B:
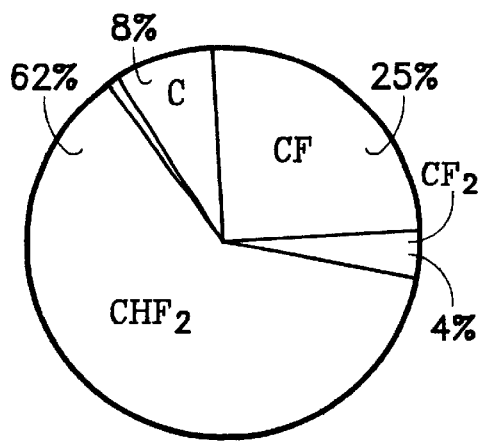
FIG. 1B illustrates the distribution of dissociated species under the same conditions and same reactor as FIG. 1A except that the source power is pulsed.

FIG. 1B illustrates the dissociation of the plasma under the same conditions as FIG. 1A except that the plasma is time-modulated. The modulation signal was 50% duty cycle having 10 $\mu$s on-time and 10 $\mu$s off-time. The pulsed plasma dissociated such that 62% of the species were $CHF_2$, 25% of the species were CF, and the rest of the species were smaller densities of other species. Thus, pulsing the plasma increased the density of $CHF_2$ from 38% in the CW plasma to 62% in the pulsed plasma. Further, the density of CF was reduced from 46% in the CW plasma to 25% in the pulsed plasma.

Figure 2A:
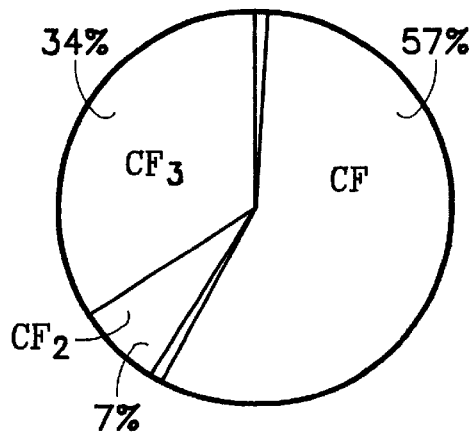
FIG. 2A shows the distribution of dissociated species under the same conditions as FIG. 1A for a process gas of $CF_4$.
Figure 2B:
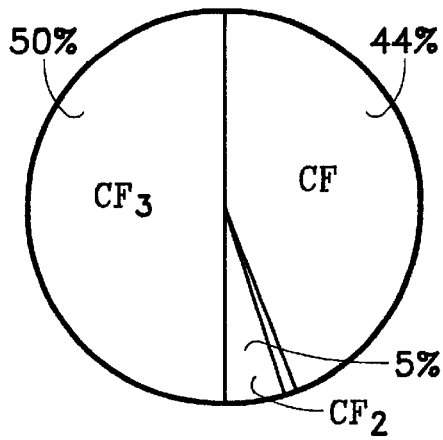
FIG. 2B shows the distribution of dissociated species under the same conditions and process gas as FIG. 2A except that the source power is pulsed.

FIGS. 2A and 2B illustrate the integrated ion energy distributions of a CW and pulsed plasma using $CF_4$ as the process gas. FIG. 2A shows the species density for the CW plasma. In particular, the species density was 57% for CF, 34% for $CF_3$ and smaller densities for other species.

FIG. 2B shows the results of pulsing the plasma at a 50% duty cycle with 10 $\mu$s on-time and 10 $\mu$s off-time. The density of CF was reduced to 44% and the density of $CF_3$ was increased to 50%. Thus, $CF_3$ begins to dominate the plasma when the plasma is pulsed. At the same time, the density of CF is reduced.

Figure 3A:
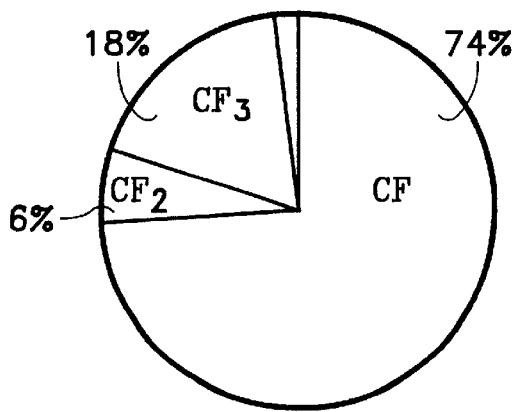
FIG. 3A illustrates the distribution of dissociated species under the same conditions as FIG. 1A for a process gas of $C_2F_6$.
Figure 3B:
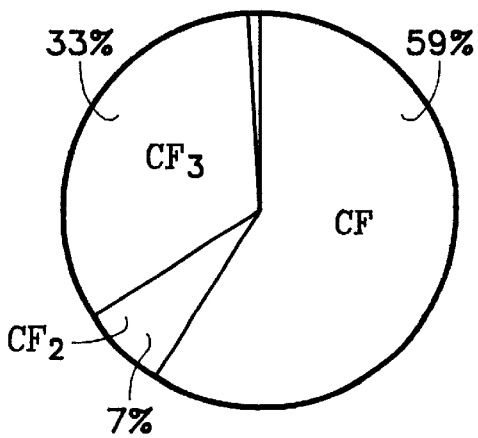
FIG. 3B illustrates the distribution of dissociated species under the same conditions and process gas as FIG. 3A except that the source power is pulsed.

In FIGS. 3A and 3B, the ion energy distributions are shown for the same conditions as the previous figures except that the process gas is $C_2F_6$. In this case the plasma is dissociated into an even greater density of CF that when the process gas is $CF_4$. FIG. 3A shows the species distribution for the CW plasma. Namely, there was 74% of CF, 18% of $CF_3$ and smaller densities of other species.

FIG. 3B shows the distribution for a pulsed plasma. The density CF was reduced to 59% and $CF_3$ was increased to 33%. Although there is still a high density of CF in the pulsed plasma, FIGS. 3A and 3B show that pulsing the plasma still improves the ratio of $CF_3$ to CF.

Figure 4A:
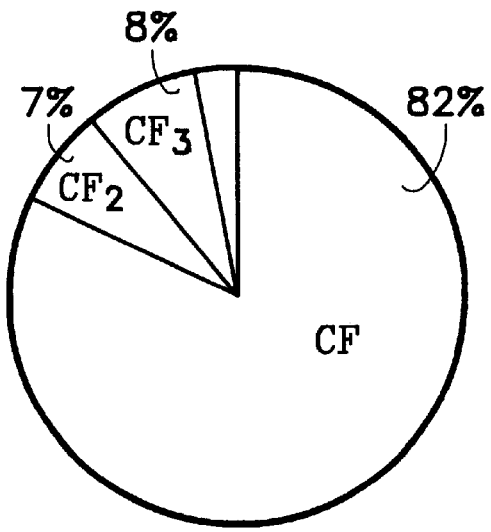
FIG. 4A presents the distribution of dissociated species under the same conditions as FIG. 1A for a process gas of $C_4F_8$.
Figure 4B:
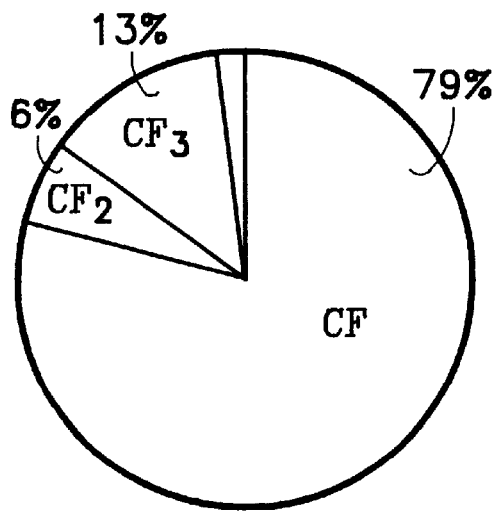
FIG. 4B presents the distribution of dissociated species under the same conditions and process gas as FIG. 4A except that the source power is pulsed.

FIGS. 4A and 4B show the ion energy distributions for a process gas of $C_4F_8$. The test conditions are the same as for the previous figures. FIG. 4A shows that the distribution is 82% of CF, 8% of $CF_3$ and the rest a smaller density of various species. The density of CF is even greater in the CW $C_4F$ plasma than for the CW $C_2F_6$ plasma. FIG. 4B shows the distribution of the pulsed $C_4F_8$ plasma. The CF species has been reduced slightly to 79% and the $CF_3$ has nearly doubled to 13%.

FIGS. 1–8 have illustrated that dissociation in several process gases can be decreased using pulsing. Although pulsing tends to have a greater effect in some chemistries, the major point is that in all process gas chemistries tested the pulsing reduced dissociation. In particular, the results showed that the ratio of bigger species to smaller species can be increased with pulsing, thereby reducing the overall dissociation within the plasma.

2. Dissociation in a CCP Reactor

Figure 5:
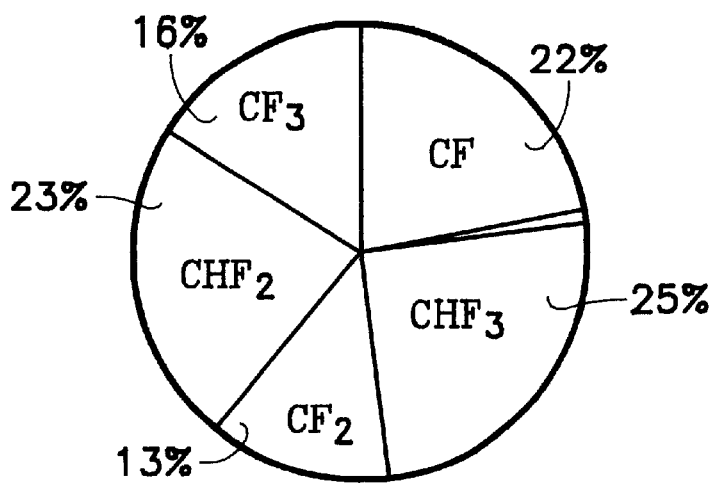
FIG. 5 illustrates the distribution of dissociated species in a capacitively coupled reactor at a pressure of 10 millitorr.
Figure 6A:
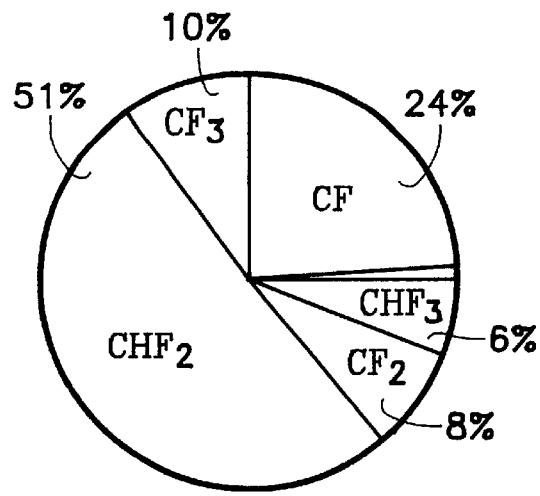
FIG. 6A illustrates the distribution of dissociated species under the same conditions as FIG. 5 except at a pressure of 50 millitorr.

In order to compare a purely capacitively coupled reactor to an inductively coupled reactor, the same test chamber used as a CCP reactor. FIGS. 5 and 6A show the results. The test conditions included 100 cc of $CHF_3$ and 100 cc of argon (Ar) with 1000 W of bias power, with the bias frequency at 13.56 Mhz, and a process gas of $CHF_3$. None of these cases had pulsed plasma.

FIG. 5 shows the integrated ion energy distribution for a capacitively coupled reactor at a chamber pressure of 10 mtorr. The greatest density was Ar at 25%, followed by $CHF_2$ at 23%, CF at 22% and other species at lower densities. The ratio of bigger species to smaller species, or $CHF_2/CF≡1$.

Typically, however, CCP reactors are not used at such lower pressures because there is little etch selectivity and almost no etch rate. Accordingly, it is not practical to compare an ICP reactor at a pressure of 10 mtorr to a CCP at the same pressure. Such CCP reactors are usually run at pressures of between 50 and 100 mtorr.

FIG. 6A presents the integrated ion energy distribution for a CCP reactor at a common chamber pressure of 50 mtorr. The greatest density of species was 51% of $CHF_2$, 24% of CF with the remainder an assortment of other species. Thus, at this favored operating pressure of 50 mtorr, the capacitively coupled reactor exhibits a relatively low dissociation with $CHF_2/CF≡2$ (the ratio of bigger species to smaller species).

3. Comparison Between ICP and CCP Reactor

Figure 6B:
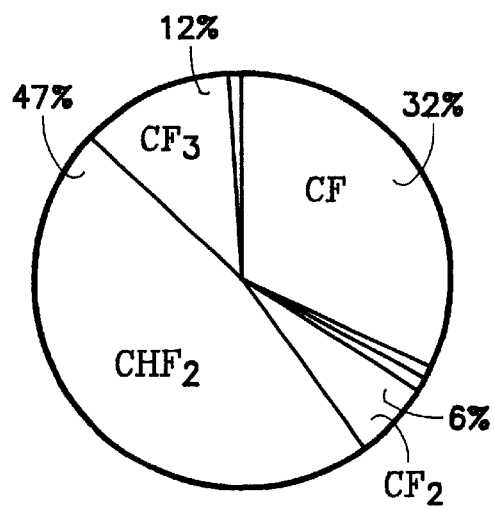
FIG. 6B illustrates the distribution of dissociated species for a pulsed inductively coupled plasma reactor having the same process gas as FIG. 6A.
Figure 6C:
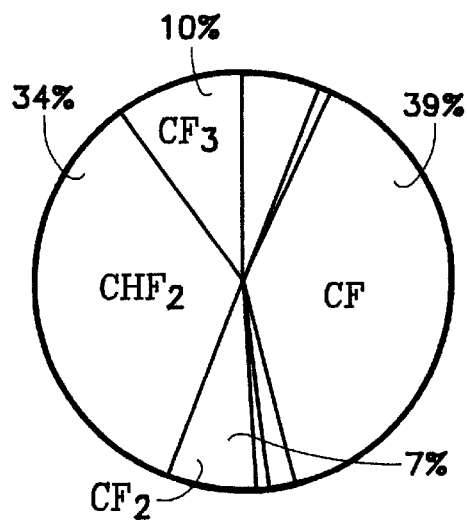
FIG. 6C illustrates the distribution of dissociated species for an unpulsed ICP reactor at the same conditions as FIG. 6B.

FIGS. 6B and 6C show the integrated ion energy distributions for a pulsed ICP and a CW ICP reactor, respectively. In order to achieve a valid comparison, most of the test conditions were identical to those test conditions for the CCP reactor of FIG. 6A. In particular, the process gas was the same 100 cc of $CHF_3$ and 100 cc of Ar. The conditions for the ICP reactor differed from the CCP reactor in that the average source power was 1000 W at 2 Mhz with 150 W of bias power at 1.6 MHz and the pressure was 10 mtorr instead of 50 mtorr as explained earlier. For the pulsed plasma, the duty cycle was 50% with a 10 $\mu$s on-time and a 10 $\mu$s off-time.

FIG. 6B shows the results for the pulsed ICP reactor. Specifically, the distribution was 47% of $CHF_2$ and 32% of CF, giving a $CHF_2/CF≡1.5$. FIG. 6C shows the distribution for the CW ICP reactor, with 34% of $CHF_2$ and 39% of CF. This gives a ratio of $CHF_2/CF≡0.87$.

This comparison between a CCP reactor, a pulsed ICP reactor and a CW ICP reactor shows that the ion energy distributions in an ICP reactor can be made very similar to the ion energy distributions in a CCP reactor by pulsing. Therefore, these tests show that pulsing can be used to improve, or decrease, the dissociation of an ICP reactor. However, another goal is to be able to actively control the dissociation of the plasma so that the dissociation can be varied from a good CCP process (FIG. 6A) to a CW ICP process (FIG. 6C) and anywhere between.

II. Method of the Invention

The method of the present invention enables the user to actively control the dissociation of the plasma so that the dissociation can be varied between a CCP reactor and a CW ICP reactor. Moreover, the dissociation can be adjusted to anywhere between these two extremes. In addition, while the dissociation is being improved, the plasma density and the etch rate of the ICP reactor are maintained. In this way the method of the present invention permits a low dissociation associated with a CCP reactor and the high plasma density and etch rate associated with an ICP reactor.

Figure 7:
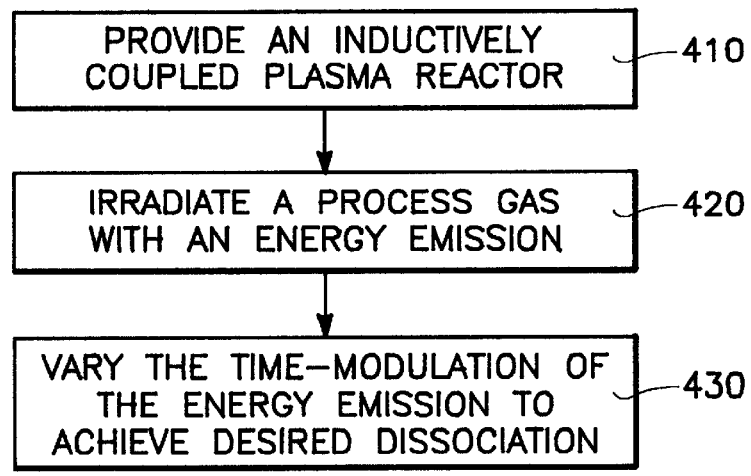
FIG. 7 is a flow process diagram of the method of the present invention.

FIG. 7 is a flow process diagram of the method of the present invention. Referring to FIG. 7, the first procedure 410 is to provide an ICP reactor in which the method can occur. Ideally, in addition to providing a high etch rate and plasma density, this ICP reactor should provide a highly uniform plasma density distribution. Further, this ICP reactor should provide a low antenna-to-workpiece gap so that the plasma density remains high and have no metal materials within the reactor chamber that will contaminate the plasma. The requirements of the plasma reactor will be discussed further below in the "Structure of the Invention."

Procedure 420 irradiates the process gas with an energy emission. The process gas may be irradiated with the energy emission within the reactor chamber or at some point prior to being introduced into the chamber. The energy emission can be from an inductive antenna, a bias power source or any other device giving an energy emission. Preferably, the energy emission is from a RF antenna and a RF bias source. When the energy emission is from a RF bias source the energy emission is an electric field. Further, energy emission may include the source power, the antenna current or the rate of change of antenna current. Thus, the source power, bias power, antenna current or rate of change of antenna current are induced within the definition of pulsing or time-modulating the energy emission.

Procedure 430 is a time-modulation or pulsing procedure. in particular, the pulsing of the energy emission is varied until the desired degree of dissociation is reached. Of course, the degree of dissociation can only vary between the dissociation of a CCP reactor and a CW ICP reactor. However, by varying the pulsing of the energy emission, any degree of dissociation between these two boundaries can be selected.

The primary way the pulsing of the energy emission is varied is by changing the on-time and the off-time of a modulating signal. The modulating signal communicates with the energy emission and controls the on-time and off-time of the energy emission. By varying the length of the on-time and the off-time a desired degree of dissociation may be selected.

Figure 8:
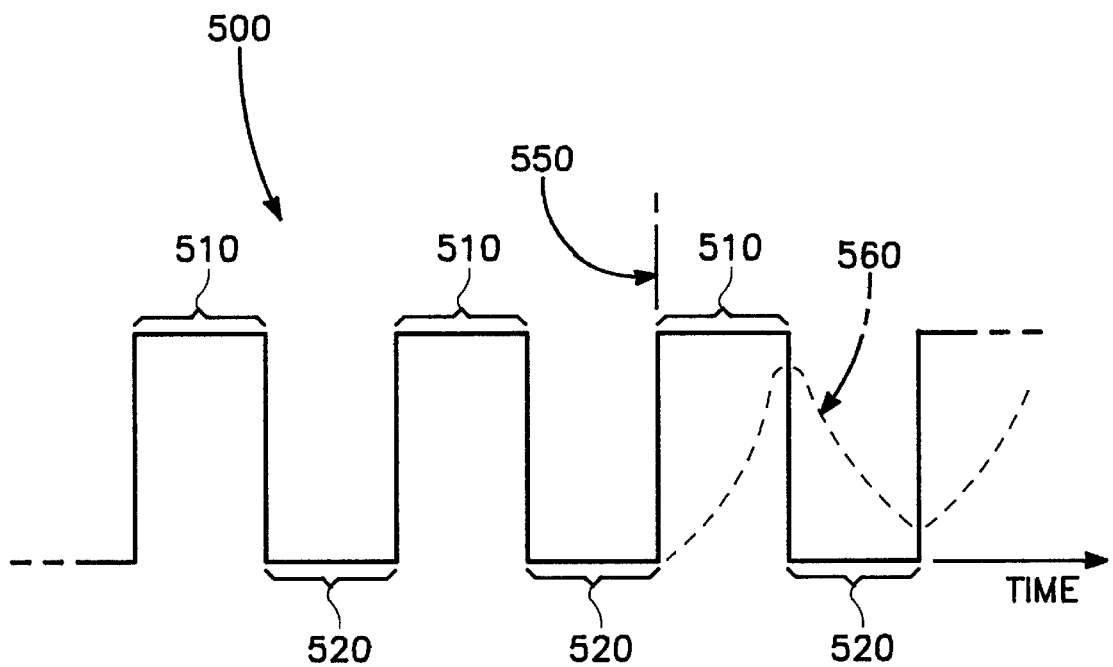
FIG. 8 shows the pulsing signal used to provide a pulsing means for the present invention.

FIG. 8 illustrates the concept of "on-time" and "off-time". FIG. 8 shows a square wave modulating signal 500 containing an on-time 510 and an off-time 520. In this example, the on-time 510 and the off-time 520 are identical. Thus, FIG. 8 represents a 50% duty cycle. As will be explained further below, however, the on-time 510 and the off-time 520 may differ from each other, thus providing a greater control over the dissociation within the plasma.

Ideally, the energy emission output would follow exactly the square wave modulating signal. in reality, however, during the on-time the energy emission tends to lag the signal on the way up to a power setting and during the off-time tends to lag on the way down to its lower level power setting. As shown in FIG. 8, the modulating signal at time 550 is "on" and the energy emission, as depicted by the dotted line 560, gradually ascends toward the desired power setting. However, if the on-time 510 is short enough the energy emission may not reach the desired power setting. Similarly, if the off-time 520 is short enough the energy emission may not fully reach zero power before rising again. Thus, whether he energy emission is "on" or "off" may not be entirely clear at all times. Therefore, to avoid confusion, the energy emission is typically defined as "on" if the energy emission is greater that about 75% of the desired power setting and "off" if less than about 25% of the desired power setting. However, these values are only used as an example and may be defined as desired by the user.

In addition, the energy emission need not go all the way to zero during the "off" time. In fact, during the off-time, the energy emission may some non-zero value that is less than the energy emission during the on-time but greater than zero. This non-zero energy emission during the off-time permits the plasma to be sustained at a higher density during the off-time. One advantage of this higher density plasma during the off-time is that the off-time can be longer.

FIGS. 9A–9D illustrate how the dissociation of the plasma changes as duty cycle is varied. Specifically, the on-time was kept constant while the off-time duration 140 was varied. In each of these figures, the integrated ion energy distributions was measured for each species. The test conditions were 100 cc of $CHF_3$ and 100 cc of Ar at 10 mtorr, 1000 W average of source power at 2 MHz, and 150 W of bias power at 1.6 MHz. The energy emission was pulsed with an on-time of 10 μs, the minimum limit of the amplifier, while varying the off-time.

The flux of the species $CHF_2$ was measured for each of the runs to determine the effect of pulsing on plasma density. This is an important parameter because, as has been shown earlier, the degree of dissociation can be controlled but it is important to also keep the plasma density high. Thus, the $CHF_2$ flux gives an idea of how good the plasma density is while the degree dissociation is being changed.

Figure 9A:
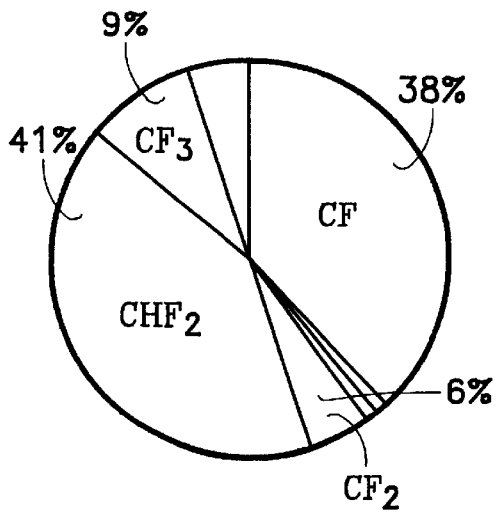
FIG. 9A presents the distribution of dissociated species in an ICP reactor having a duty cycle of 100% (unpulsed).

FIG. 9A shows the results for a CW (non-pulsed) plasma, or a 100% duty cycle. The density of $CHF_2$ was 41% and the density of CF was 38%, yielding a ratio of $CHF_2/CF≡1.06$. Further, the $CHF_2$ flux≡9.12E5.

Figure 9B:
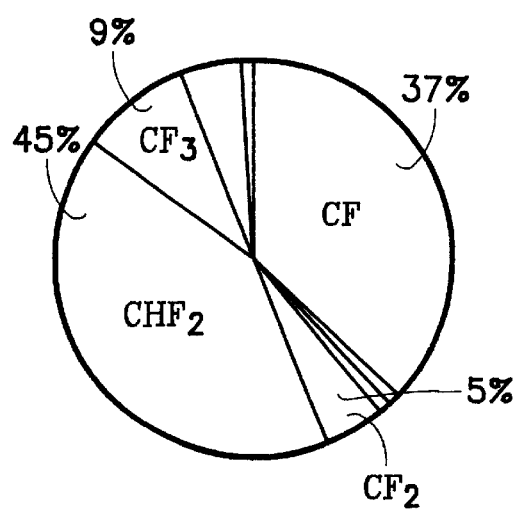
FIG. 9B presents the distribution of dissociated species under the same conditions as FIG. 9A except at a 67% duty cycle.

FIG. 9B show the results for a 67% duty cycle, with 10 μs on-time and 5 μs off-time. This short off-time gave the plasma a very short cooling time. In addition, to keep an average source power of 1000 W the peak source power was 1500 W. The density of $CHF_2$ was 45% and CF was 37%, giving a ratio of $CHF_2/CF≡1.24$. The $CHF_2$ flux≡11.0E5. Thus, the dissociation of the plasma was reduced while the plasma density actually increased slightly.

Figure 9C:
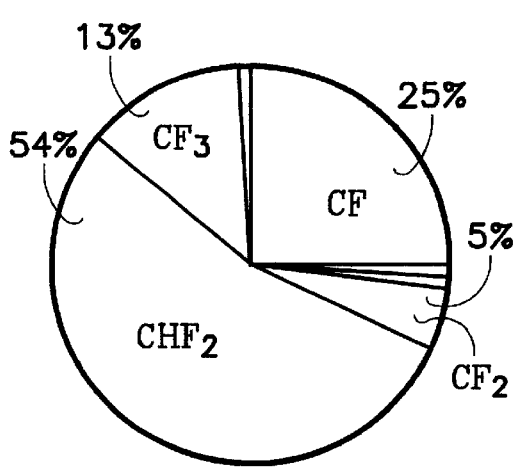
FIG. 9C presents the distribution of dissociated species under the same conditions as FIGS. 9A and 9B except at a 50% duty cycle.

FIG. 9C illustrates the results for a 50% duty cycle with an on-time of 10 μs and an off-time of 10 μs. The peak source power for this run was 2000 W. The density of $CHF_2$ was 54% and CF was 25%, yielding a ratio of $CHF_2/CF≡2.17$, and a $CHF_2$ flux≡9.82E5. Thus, the ratio of bigger species to smaller species, or $CHF_2/CF$, has more than doubled over the CW plasma. Moreover, the $CHF_2$ flux, or plasma density, is staying about the same within the experimental error.

Figure 9D:
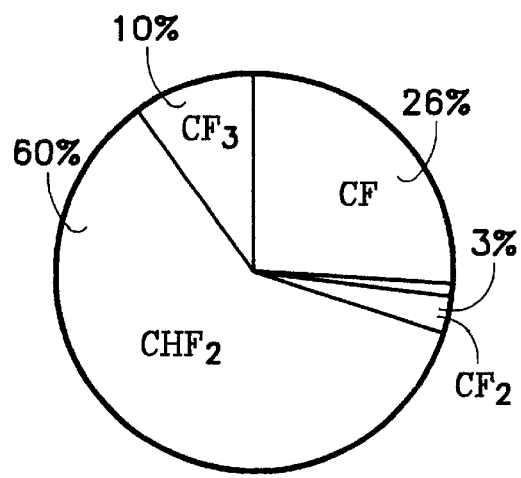
FIG. 9D presents the distribution of dissociated species under the same conditions as FIGS. 9A, 9B and 9C except at a 33% duty cycle.

FIG. 9D shows the results from a 33% duty cycle with 10 μs on-time and 20 μs off-time. At these conditions, in order to keep an average power of 1000 W the peak power is 3000 W, which is about the limit of the equipment. At the 33% duty cycle, the density of $CHF_2$ was 60% and CF was 26%, with a ratio of $CHF_2/CF≡2.27$, and a $CHF_2$ flux≡10.4E5. At this duty cycle, the ratio of $CHF_2/CF$ is close to saturation. However, the trend is that the ratio, and therefore the degree of dissociation, is still improving.

Figure 10A:
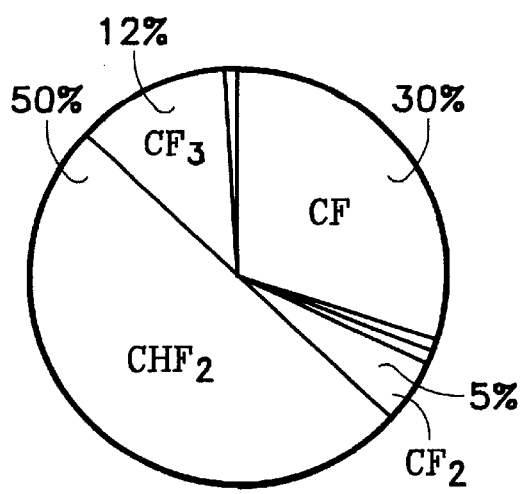
FIG. 10A illustrates the distribution of dissociated species under the same conditions as FIGS. 9 having a 10 □s on-time and a 10 □s off-time.
Figure 10B:
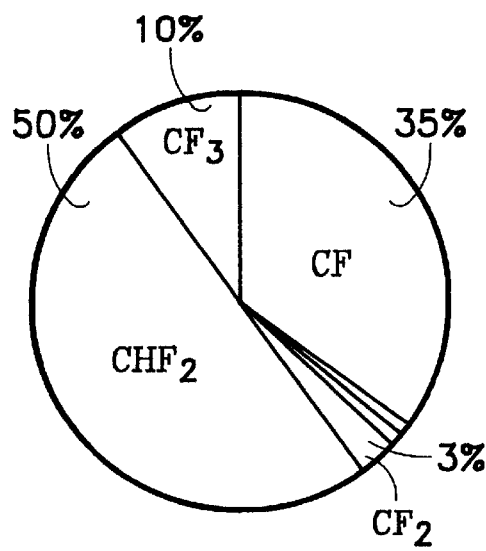
FIG. 10B illustrates the distribution of dissociated species under the same conditions as FIG. 10A but having a 20 □s on-time and a 20 □s off-time.
Figure 10C:
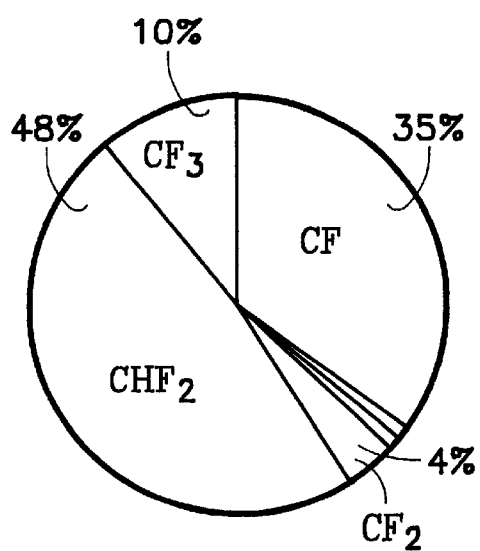
FIG. 10C illustrates the distribution of dissociated species under the same conditions as FIGS. 10A and 10B but having a 30 □s on-time and a 30 □s off-time.

In FIGS. 10A–10C, the duty cycle was held at 50% (equal on-time duration and off-time duration) and the effect of varying the pulse cycle time was examined. The pulse cycle time is how long it takes the cycle to be repeated and is determined by adding the on-time duration and the off-time duration. For example, a pulse with an on-time of 10 μs and an off-time of 20 μs would have a pulse cycle time of 30 μs. The test conditions were identical to those of FIGS. 9A–9D.

FIG. 10A shows the degree of dissociation (integrated ion density distribution) for a pulse cycle time of 20 $\mu$s (10 $\mu$s on-time, 10 $\mu$s off-time). The density of $CHF_2$ was 50% and CF was 30%, giving a ratio of $CHF_2/CF \equiv 1.69$. Moreover, the $CHF_2$ flux$\equiv$7.52E5.

FIG. 10B illustrates the results for a pulse cycle time of 40 $\mu$s (20 $\mu$s on-time, 20 $\mu$s off-time). The density of $CHF_2$ was 50% and CF was 35%, with a ratio of $CHF_2/CF \equiv 1.40$, and a $CHF_2$ flux$\equiv$6.94E5.

FIG. 10C shows the results for a pulse cycle time of 60 $\mu$s (30 $\mu$s on-time, 30 $\mu$s off-time). The density of $CHF_2$ was 48% and CF was 35%, giving a ratio of $CHF_2/CF \equiv 1.36$, and a $CHF_2$ flux$\equiv$6.83E5.

From FIGS. 10A–10C it is apparent that there is an advantage to using a shorter pulse cycle time. Combining the information from FIGS. 9A–9D and FIGS. 10A–10C the conclusion is that, the least degree of dissociation will occur with a shorter on-time (at least down to 10 microseconds) and a long off-time. However, the long off-time is bounded by the constraint that the plasma density must not drop too low. Realistically, therefore, the greatest reduction in dissociation will occur with an on-time of 5–15 microseconds and an off-time more than 30 microseconds.

Referring again to FIG. 7, the time-modulation procedure 430 is carried out by varying both the on-time and the off-time of the modulating signal pulsing the energy emission. If a dissociation characteristic of a CCP reactor (i.e., low dissociation) is desired, the on-time should be short and the off-time should be long. Similarly, if a high etch rate but low etch selectivity is desired, such as in an CW ICP reactor), the pulsing can be ceased. Moreover, by varying the on-time and the off-time of the energy emission the degree of dissociation can be set anywhere between these two limits. Moreover, pulsing the plasma decouples the dissociation from the plasma density and permits the dissociation to be changed without a significantly variation in the plasma density.

In a preferred embodiment the method of the present invention further includes providing an ICP reactor with a bias source that generates an electric field. Moreover, the method includes pulsing the electric field using a modulating signal. This modulating signal may be the same or different as the signal used to modulate the energy emission as described above. In addition, this method includes any number of variations of pulsing the bias and pulsing the energy emission.

The advantage to pulsing the electric field of the bias source is that the benefits of pulsing the energy emission are enhanced. Specifically, electron density varies much less than the electron temperature. Without bias pulsing, and only pulsing the energy emission, the bias envelope is almost the inverse of the source power envelope.

Even if the bias source is not pulsed, pulsing the energy emission will have a pulsing effect on the bias. This is true even though the bias power remains the same. Thus, the bias voltage will be lower when the plasma is strong and the electron temperature is high (pulsed energy emission on-time) and the bias voltage will be higher when the electron temperature is low and the plasma is weak.

In a preferred embodiment, the bias source synchronized in some way to the pulsed energy emission. For example, the bias source could be pulsed so that the bias off-time occurs at the energy emission on-time and the bias on-time occurs at the energy emission off-time. This would result in active etching of the workpiece during the time when the cooler species are in the plasma. In addition, the bias modulation and the energy emission modulation could be phase-lagged or perfectly synchronized.

III. Structure of the Invention

The above-described method can be carried out in an ICP reactor of the present invention. In general, an ICP reactor achieves greater plasma density and etch rate and is thus preferred over a CCP reactor. Further, using the method of the present invention, the high degree of dissociation inherent in an ICP reactor can be significantly reduced by time-modulating the plasma without significantly degrading the plasma density and etch rate.

A. ICP Reactor with a Non-Metallic Chamber

When an ICP reactor has a metal on the interior surfaces of the reactor chamber, the interaction of the plasma and the metal can cause contamination of the plasma. In order to avoid this problem, it is desirable to have a non-metallic reactor chamber for plasma etch processing.

Figure 11:
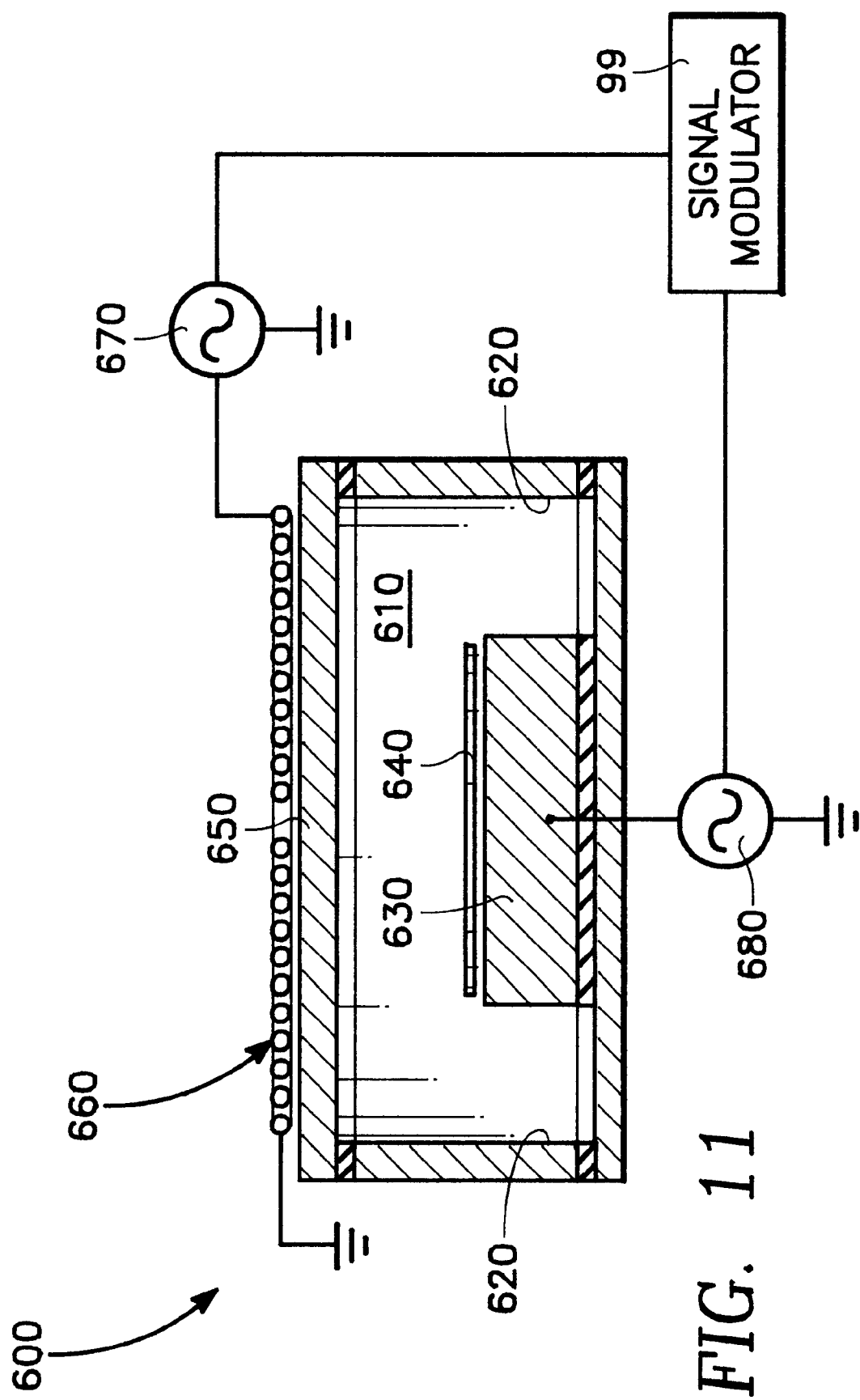
FIG. 11 is a cut-away side view of a plasma reactor of the present invention that has a non-metallic chamber.

Accordingly, FIG. 11 shows a preferred embodiment of an ICP reactor 600 having a non-metallic reactor chamber 610. In particular, the reactor chamber 610 includes interior surfaces 620 that are made of non-metallic materials. The material may be a semiconductor material, preferably silicon. As stated above, the advantage of using an all semiconductor chamber is that the plasma is free of any contaminants that occur when the plasma contacts a metal surface.

The reactor 600 further includes a workpiece support 630 for holding a workpiece 640 and a ceiling 650 overlying the workpiece support 620. An antenna 660 overlies the ceiling 250 and is coupled to a power source 670. Preferably, the power source 670 is an RF power generator. A bias source 680, preferably a RF power generator, is coupled to the workpiece support 630. A signal modulator 99 is connected to control the power source 670 and provide the means necessary to pulse the energy emission from the antenna 660. A signal modulator 690 may also be connected to the bias source 680 for pulsing the electric field of the bias source 680. These signal modulators 690 may be used together or separately when pulsing the plasma.

B. ICP Reactor with Solenoidal Antenna

Another desirable feature in an ICP reactor is the ability to operate at a high pressure. Moreover, it is advantageous to have a low antenna-to-workpiece gap. Specifically, operating at a higher pressure increases the etch selectivity. This is because the polymerization processes typically employed in a high density plasma etch reactor to protect underlying non-oxygen-containing (e.g., silicon, polysilicon or photoresist) layers during etching of an overlying oxygen-containing (e.g., silicon dioxide) layer are more efficient at higher chamber pressures (e.g., above about 20–500 mT) than at lower pressures. Polymer precursor gases in the chamber tend to polymerize strongly on non-oxygen-containing surfaces, particularly at higher chamber pressures, and only weakly on oxygen-containing surfaces. Thus, the non-oxygen-containing surfaces are relatively well-protected from etching while oxygen-containing surfaces are relatively unprotected and are etched. Such a polymerization process enhances the oxide-to-silicon etch selectivity better at higher chamber pressures because the polymerization rate is higher at higher pressures such as 100 mT. Therefore, it is desirable to operate at a relatively high chamber pressure when plasma-etching oxygen-containing layers over non-oxygen-containing layers.

Providing a low antenna-to-workpiece gap is advantageous because doing so increases the plasma density and the etch rate. The problem, however, with both the higher pressure and the low antenna-to-workpiece gap is that the plasma density across the surface of the workpiece becomes non-uniform. In particular, a null area is produced over the center of the workpiece so that no electrons are produced in that region. Further, the electrons produced in other regions generally cannot diffuse to the workpiece center region because of recombination with gas particles and chamber surfaces. Ultimately, at small antenna-to-workpiece distances the center null forms and yields an unacceptable plasma uniformity.

The present invention overcomes these problems using the approach disclosed in the above-referenced U.S. application Ser. No. 08/648,254 by Kenneth S. Collins et al. and entitled "Inductively Coupled RF Plasma Reactor having an Overhead Solenoidal Antenna", for increasing the uniformity of the plasma density distribution. Specifically, the present invention includes a means for adjusting such process parameters so as to configure the plasma density distribution across the surface of the workpiece. More specifically, the adjusting means includes using a solenoidal RF inductive antenna to compensate for the null experienced when the antenna-to-workpiece gap is small. Thus, the plasma density can be increased by reducing the antenna-to-workpiece while still permitting greater plasma density uniformity across the surface of the workpiece.

Figure 12C:
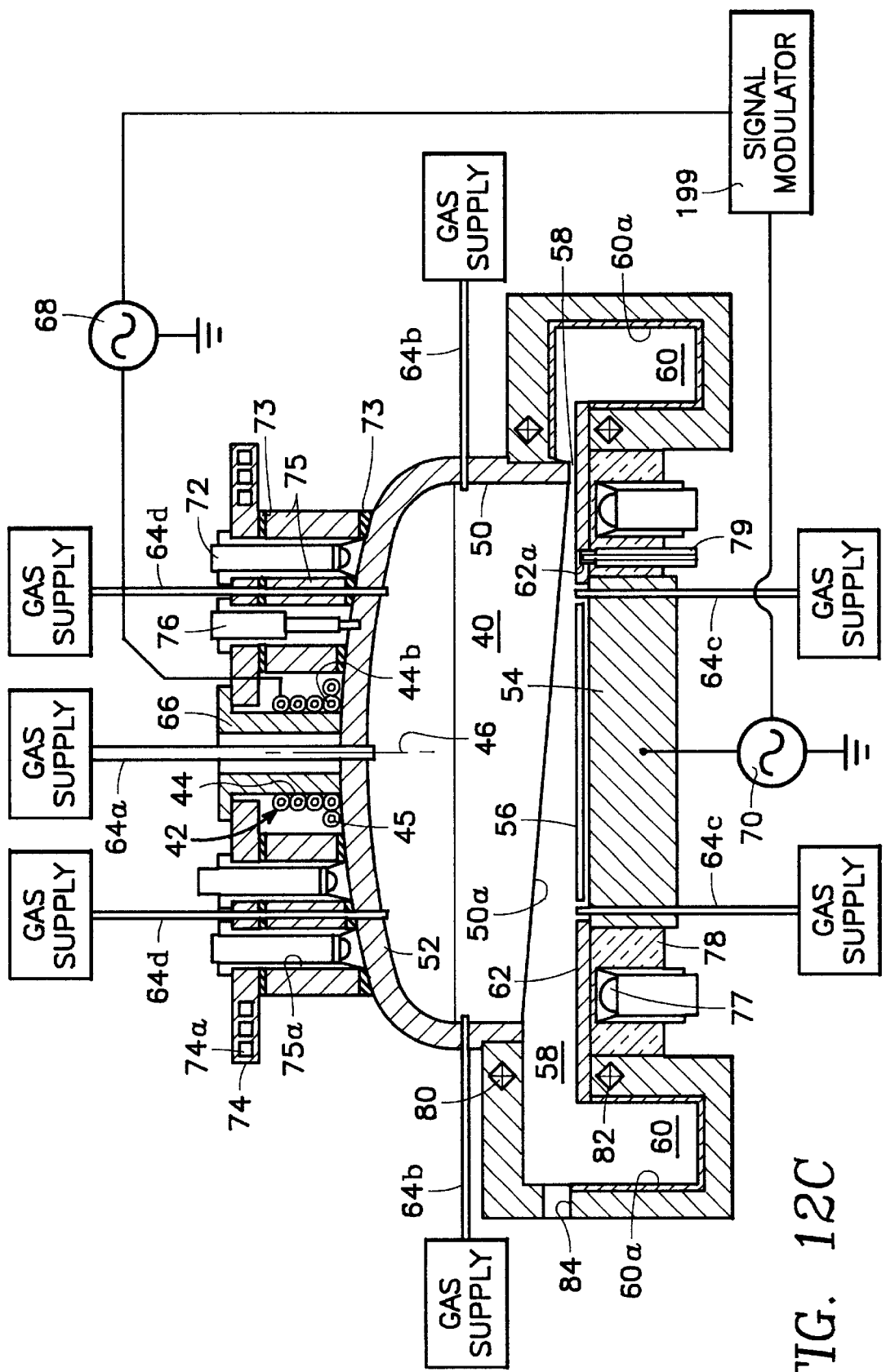
FIG. 12C is a cut-away side view of a plasma reactor corresponding to FIG. 12A but having a dome-shaped ceiling.

FIG. 12A illustrates a single solenoid embodiment of an inductively coupled RF plasma reactor having a short antenna-to-workpiece gap, meaning that the skin depth of the induction field is on the order of the gap length. As understood in this specification, a skin depth which is on the order of the gap length is that which is within a factor of ten of (i.e., between about one is tenth and about ten times) the gap length.

Each of the following embodiments includes a signal modulator 199 connected to a RF power supply 68. In addition, the signal modulator 199 may also be connected to a RF bias power supply 70 for pulsing the electric field of the RF bias power supply 70. This signal modulator 199 may be used together or separately when pulsing the plasma, so that the electric field of the RF bias power supply 70 and the energy emission of the RF power supply 68 may used separately or simultaneously.

Figure 13:
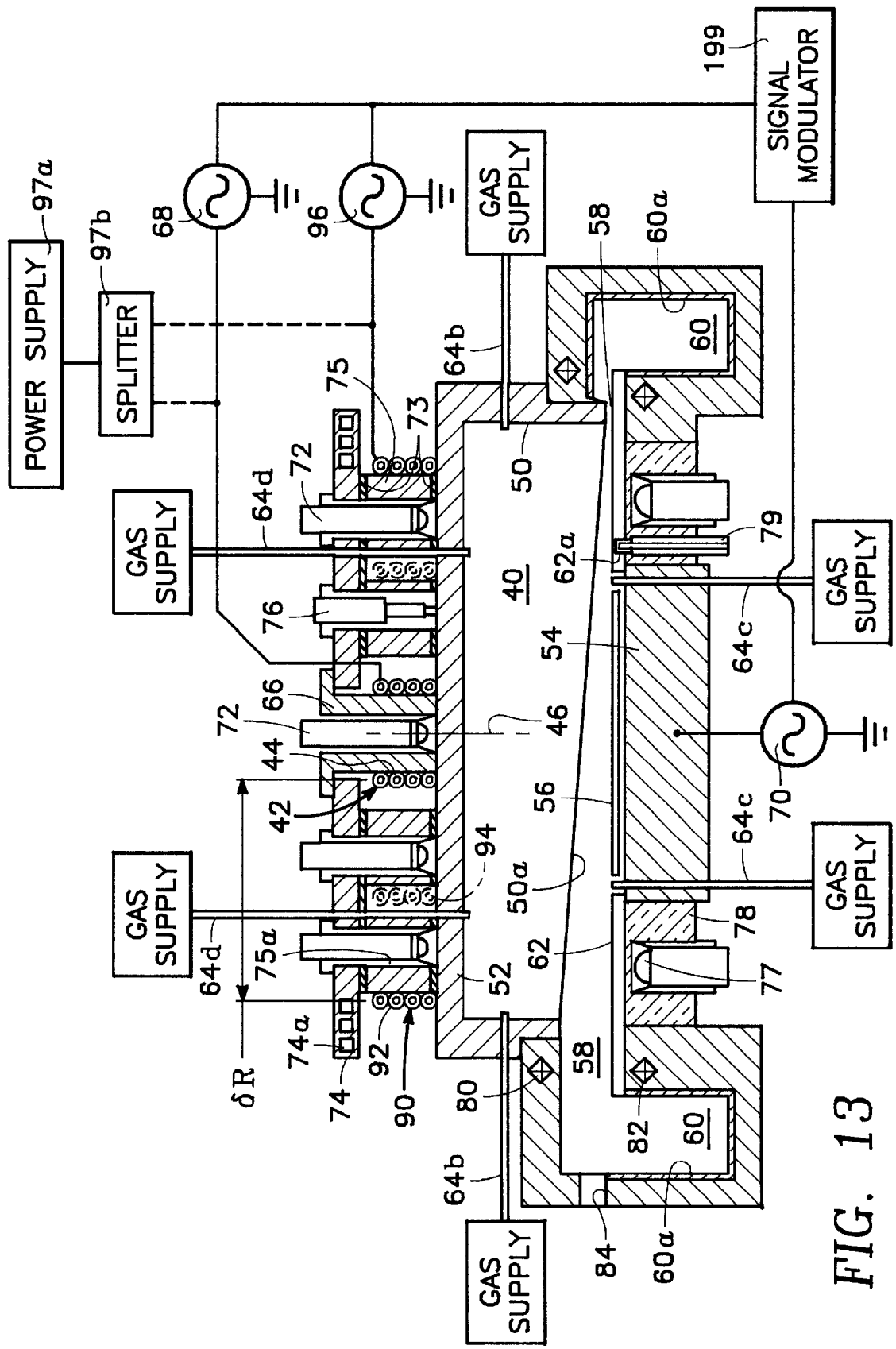
FIG. 13 is a cut-away side view of a plasma reactor in accordance with an alternative embodiment of the present invention employing inner and outer vertical solenoid windings.

FIG. 13 illustrates a dual solenoid embodiment of an inductively coupled RF plasma reactor, and is a preferred embodiment of the invention. Except for the dual solenoid feature, the reactor structure of the embodiments of FIGS. 12A and 13 is nearly the same, and will now be described with reference to FIG. 12A. The reactor includes a cylindrical chamber 40 similar to that of FIG. 11, except that the reactor of FIG. 12A has a non-planar coil antenna 42 whose windings 44 are closely concentrated in non-planar fashion near the antenna symmetry axis 46. While in the illustrated embodiment the windings 44 are symmetrical and their symmetry axis 46 coincides with the center axis of the chamber, the invention may be carried out differently. For example, the windings may not be symmetrical or their axis of symmetry may not coincide. However, in the case of a symmetrical antenna, the antenna has a radiation pattern null near its symmetry axis 46 coinciding with the center of the chamber or the workpiece center. Close concentration of the windings 44 about the center axis 46 compensates for this null and is accomplished by vertically stacking the windings 44 in the manner of a solenoid so that they are each a minimum distance from the chamber center axis 46. This increases the product of current (I) and coil turns (N) near the chamber center axis 46 where the plasma ion density has been the weakest for short antenna-to-workpiece heights. As a result, the RF power applied to the non-planar coil antenna 42 produces greater induction [d/dt][NCI] at the wafer center—at the antenna symmetry axis 46—(relative to the peripheral regions) and therefore produces greater plasma ion density in that region, so that the resulting plasma ion density is more nearly uniform despite the small antenna-to-workpiece gap. Thus, the invention provides a way for reducing the ceiling height for enhanced plasma process performance without sacrificing process uniformity.

The drawing of FIG. 12B best shows a preferred implementation of the windings employed in the embodiments of FIGS. 12A and 13. In order that the windings 44 be at least nearly parallel to the plane of the workpiece 56, they preferably are not wound in the usual manner of a helix but, instead, are preferably wound so that each individual turn is parallel to the (horizontal) plane of the workpiece 56 except at a step or transition 44a between turns (from one horizontal plane to the next).

Figure 12D:
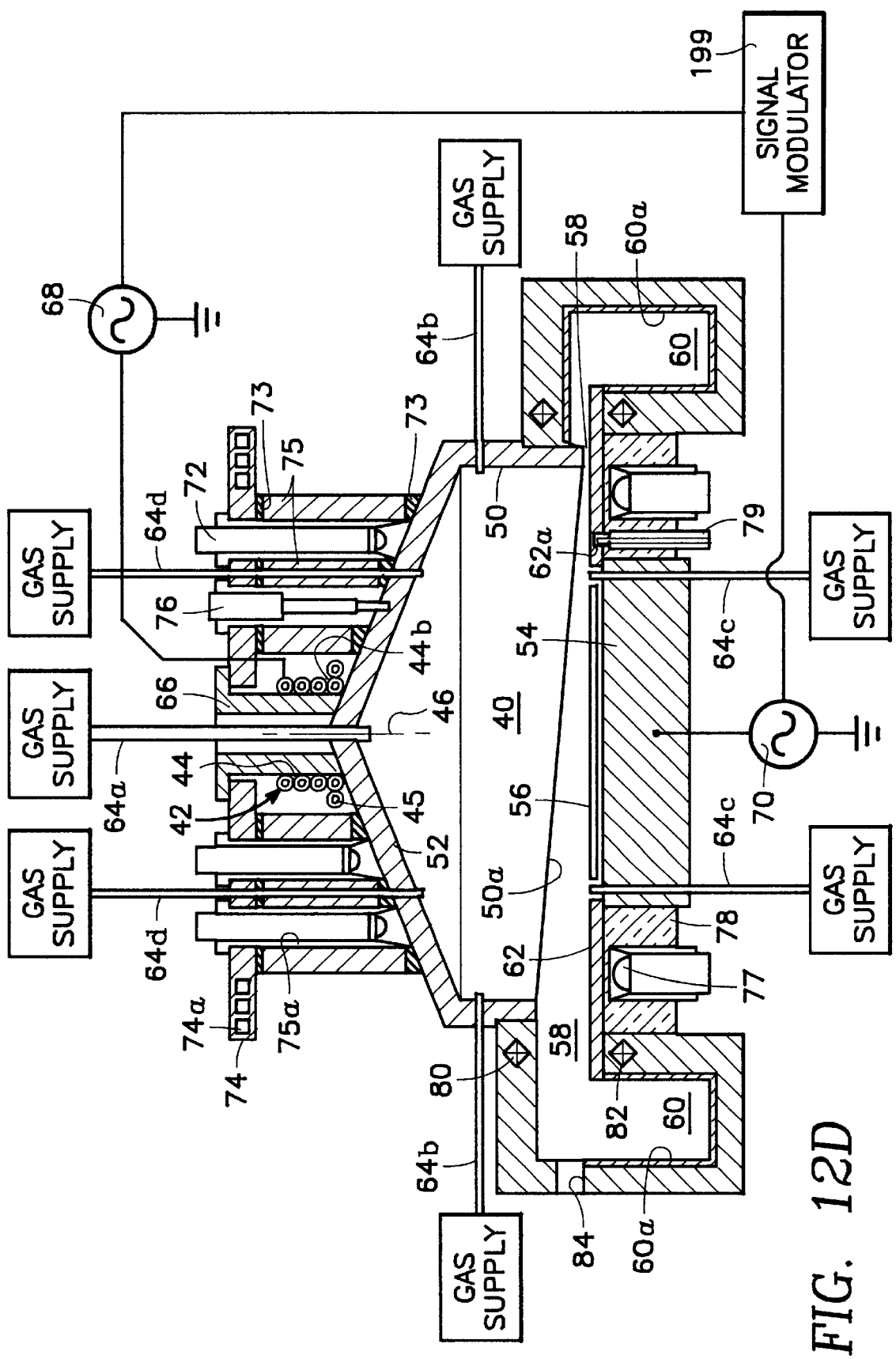
FIG. 12D is a cut-away side view of a plasma reactor corresponding to FIG. 12A but having a conical ceiling.
Figure 12E:
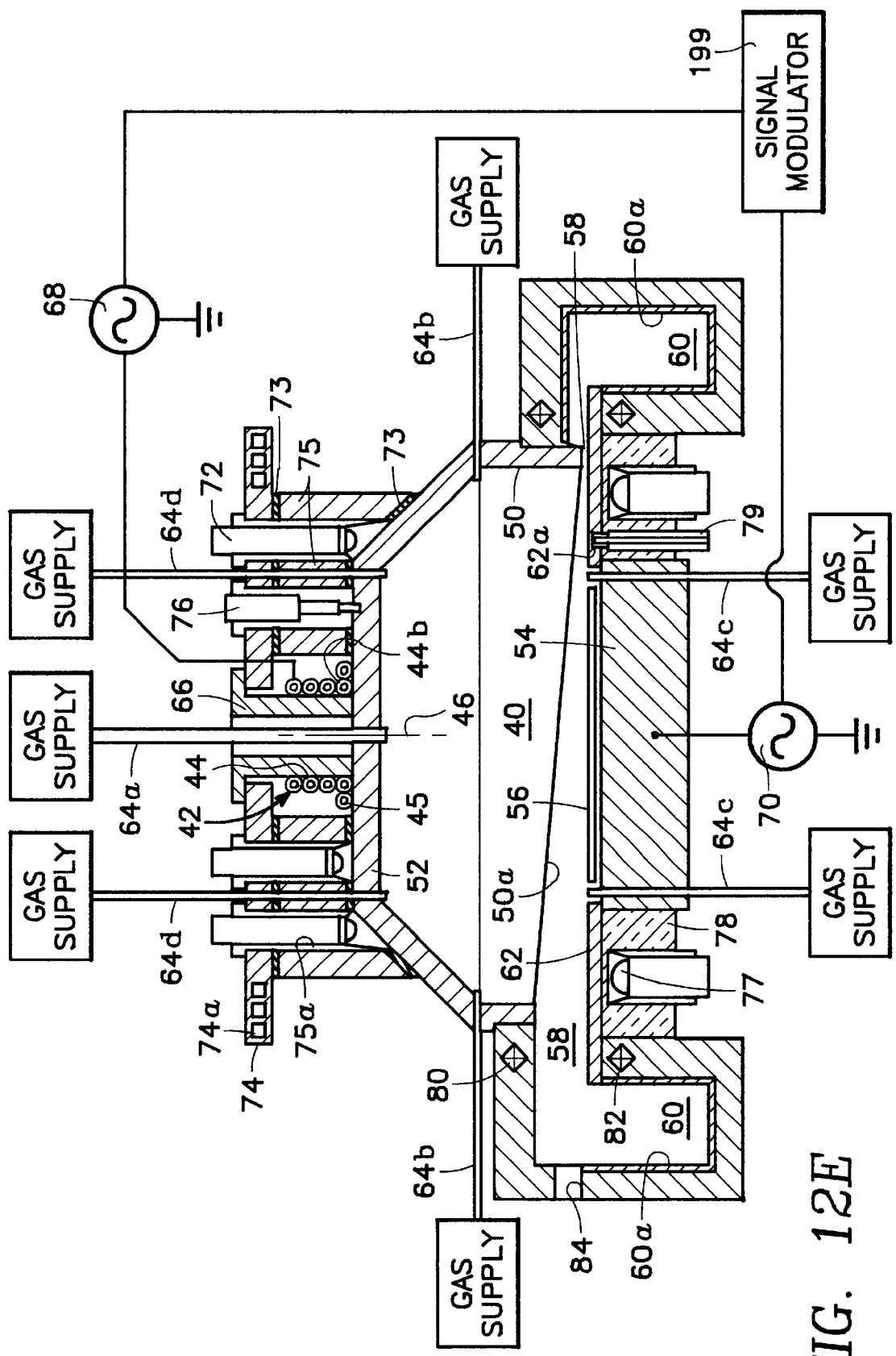
FIG. 12E is a cut-away side view of a plasma reactor corresponding to FIG. 12D but having a truncated conical ceiling.

The cylindrical chamber 40 consists of a cylindrical side wall 50 and a circular ceiling 52 integrally formed with the side wall 50 so that the side wall 50 and ceiling 52 constitute a single piece of material, such as silicon. However, the invention may be carried out with the side wall 50 and ceiling 52 formed as separate pieces, as will be described later in this specification. The circular ceiling 52 may be of any suitable cross-sectional shape such as planar (FIG. 12A), dome (FIG. 12C), conical (FIG. 12D), truncated conical (FIG. 12E), cylindrical or any combination of such shapes or curve of rotation. Such a combination will be discussed later in this specification. Generally, the vertical pitch of the solenoid 42 (i.e., its vertical height divided by its horizontal width) exceeds the vertical pitch of the ceiling 52, even for ceilings defining three-dimensional surfaces such as dome, conical, truncated conical and so forth. The purpose for this, at least in the preferred embodiment, is to concentrate the induction of the antenna near the antenna symmetry axis. A solenoid having a pitch exceeding that of the ceiling 52 is referred to herein as a non-conformal solenoid, meaning that, in general, its shape does not conform with the shape of the ceiling, and more specifically that its vertical pitch exceeds the vertical pitch of the ceiling. A two-dimensional or flat ceiling has a vertical pitch of zero, while a three-dimensional ceiling has a non-zero vertical pitch.

A workpiece support 54 at the bottom of the chamber 40 supports a planar workpiece 56 in a workpiece support plane during processing. The workpiece 56 is typically a semiconductor wafer and the workpiece support plane is generally the plane of the wafer or workpiece 56. The chamber 40 is evacuated by a pump (not shown in the drawing) through an annular passage 58 to a pumping annulus 60 surrounding the lower portion of the chamber 40. The interior of the pumping annulus may be lined with a replaceable metal liner 60a. The annular passage 58 is defined by the bottom edge 50a of the cylindrical side wall 50 and a is planar ring 62 surrounding the workpiece support 54. Process gas is furnished into the chamber 40 through any one or all of a variety of gas feeds. In order to control process gas flow near the workpiece center, a center gas feed 64a can extend downwardly through the center of the ceiling 52 toward the center of the workpiece 56 (or the center of the workpiece support plane). In order to control gas flow near the workpiece periphery (or near the periphery of the workpiece support plane), plural radial gas feeds 64b, which can be controlled independently of the center gas feed 64a, extend radially inwardly from the side wall 50 toward the workpiece periphery (or toward the workpiece support plane periphery), or base axial gas feeds 64c extend upwardly from near the workpiece support 54 toward the workpiece periphery, or ceiling axial gas feeds 64d can extend downwardly from the ceiling 52 toward the workpiece periphery. Etch rates at the workpiece center and periphery can be adjusted independently relative to one another to achieve a more radially uniform etch rate distribution across the workpiece by controlling the process gas flow rates toward the workpiece center and periphery through, respectively, the center gas feed 64a and any one of the outer gas feeds 64b–d. This feature of the invention can be carried out with the center gas feed 64a and only one of the peripheral gas feeds 64b–d.

The solenoidal coil antenna 42 is wound around a housing 66 surrounding the center gas feed 64a. A plasma source RF power supply 68 is connected across the coil antenna 42 and a bias RF power supply 70 is connected to the workpiece support 54.

Confinement of the overhead coil antenna 42 to the center region of the ceiling 52 leaves a large portion of the top surface of the ceiling 52 unoccupied and therefore available for direct contact with temperature control apparatus including, for example, plural radiant heaters 72 such as tungsten halogen lamps and a water-cooled cold plate 74 which may be formed of copper or aluminum for example, with coolant passages 74a extending therethrough. Preferably the coolant passages 74a contain a coolant of a known variety having a high thermal conductivity but a low electrical conductivity, to avoid electrically loading down the antenna or solenoid 42. The cold plate 74 provides constant cooling of the ceiling 52 while the maximum power of the radiant heaters 72 is selected so as to be able to overwhelm, if necessary, the cooling by is the cold plate 74, facilitating responsive and stable temperature control of the ceiling 52. The large ceiling area irradiated by the heaters 72 provides greater uniformity and efficiency of temperature control. It should be noted that radiant heating is not necessarily required in carrying out the invention, and the skilled worker may choose to employ an electric heating element instead, as will be described later in this specification. If the ceiling 52 is silicon, as disclosed in co-pending U.S. application Ser. No. 08/597,577 filed Feb. 2, 1996 by Kenneth S. Collins et al., then there is a significant advantage to be gained by thus increasing the uniformity and efficiency of the temperature control across the ceiling. Specifically, where a polymer precursor and etchant precursor process gas (e.g., a fluorocarbon gas) is employed and where the etchant (e.g., fluorine) must be scavenged, the rate of polymer deposition across the entire ceiling 52 and/or the rate at which the ceiling 52 furnishes a fluorine etchant scavenger material (silicon) into the plasma is better controlled by increasing the contact area of the ceiling 52 with the temperature control heater 72. The solenoid antenna 42 increases the available contact area on the ceiling 52 because the solenoid windings 44 are concentrated at the center axis of the ceiling 52.

The increase in available area on the ceiling 52 for thermal contact is exploited in a preferred implementation by a highly thermally conductive torus 75. This torus 75 is formed of a ceramic such as aluminum nitride, aluminum oxide or silicon nitride or of a non-ceramic like silicon either lightly doped or undoped. The bottom surface of the torus 75 rests on the ceiling 52 and the top surface supports the cold plate 74. One feature of the torus 75 is that it displaces the cold plate 74 well-above the top of the solenoid 42. This feature substantially mitigates or nearly eliminates the reduction in inductive coupling between the solenoid 42 and the plasma which would otherwise result from a close proximity of the conductive plane of the cold plate 74 to the solenoid 42. In order to prevent such a reduction in inductive coupling, it is preferable that the distance between the cold plate 74 and the top winding of the solenoid 42 be at least a substantial fraction (e.g., one half) of the total height of the solenoid 42. Plural axial holes 75a extending through the torus 75 are spaced along two concentric circles and hold the plural radiant heaters or lamps 72 and permit them to directly irradiate the ceiling 52. For greatest lamp efficiency, the hole interior surface may be lined with a reflective (e.g., aluminum) layer. The center gas feed 64a of FIG. 12A may be replaced by a radiant heater 72 (as shown in FIG. 13), depending upon the particular reactor design and process conditions. The ceiling temperature is sensed by a sensor such as a thermocouple 76 extending through one of the holes 75a not occupied by a lamp heater 72. For good thermal contact, a highly thermally conductive elastomer 73 such as silicone rubber impregnated with boron nitride is placed between the ceramic torus 75 and the copper cold plate 74 and between the ceramic torus 75 and the silicon ceiling 52.

As disclosed in the above-referenced co-pending application, the chamber 40 may be an all-semiconductor chamber, in which case the ceiling 52 and the side wall 50 are both a semiconductor material such as silicon. As described in the above-referenced co-pending application, controlling the temperature of, and RF bias power applied to, either the ceiling 52 or the wall 50 regulates the extent to which it furnishes fluorine scavenger precursor material (silicon) into the plasma or, alternatively, the extent to which it is coated with polymer. The material of the ceiling 52 is not limited to silicon but may be, in the alternative, silicon carbide, silicon dioxide (quartz), silicon nitride or a ceramic.

As described in the above-referenced co-pending application, the chamber wall or ceiling 50, 52 need not be used as the source of a fluorine scavenger material. Instead, a disposable silicon member can be placed inside the chamber 40 and maintained at a sufficiently high temperature to prevent polymer condensation thereon and permit silicon material to be removed therefrom into the plasma as fluorine scavenging material. In this case, the wall 50 and ceiling 52 need not necessarily be silicon, or if they are silicon they may be maintained at a temperature (and/or RF bias) near or below the polymer condensation temperature (and/or a polymer condensation RF Dias threshold) so that they are coated with polymer from the plasma so as to be protected from being consumed. While the disposable silicon member may take any appropriate form, in the embodiment of FIG. 12A the disposable silicon member is an annular ring 62 surrounding the workpiece support 54. Preferably, the annular ring 62 is high purity silicon and may be doped to alter its electrical or optical properties. In order to maintain the silicon ring 62 at a sufficient temperature to ensure its favorable participation in the plasma process (e.g., its contribution of silicon material into the plasma for fluorine scavenging), plural radiant (e.g., tungsten halogen lamp) heaters 77 arranged in a circle under the annular ring 62 heat the silicon ring 62 through a quartz window 78. As described in the above-referenced co-pending application, the heaters 77 are controlled in accordance with the measured temperature of the silicon ring 62 sensed by a temperature sensor 79 which may be a remote sensor such as an optical pyrometer or a fluoro-optical probe. The sensor 79 may extend partially into a very deep hole 62a in the ring 62, the deepness and narrowness of the hole tending at least partially to mask temperature-dependent variations in thermal emissivity of the silicon ring 62, so that it behaves more like a gray-body radiator for more reliable temperature measurement.

As described previously and in U.S. application Ser. No. 08/597,577 referred to above, an advantage of an all-semiconductor chamber is that the plasma is free of contact with contaminant producing materials such as metal, for example. For this purpose, plasma confinement magnets 80, 82 adjacent the annular opening 58 prevent or reduce plasma flow into the pumping annulus 60. To the extent any polymer precursor and/or active species succeeds in entering the pumping annulus 60, any resulting polymer or contaminant deposits on the replaceable interior liner 60a may be prevented from re-entering the plasma chamber 40 by maintaining the liner 60a at a temperature significantly below the polymer condensation temperature, for example, as disclosed in the referenced co-pending application.

A wafer slit valve 84 through the exterior wall of the pumping annulus 60 accommodates wafer ingress and egress. The annular opening 58 between the chamber 40 and pumping annulus 60 is larger adjacent the wafer slit valve 84 and smallest on the opposite side by virtue of a slant of the bottom edge 50a of the cylindrical side wall 50 so as to make the chamber pressure distribution more symmetrical with a non-symmetrical pump port location.

Maximum inductance near the chamber center axis 46 is achieved by the vertically stacked solenoidal windings 44. In the embodiment of FIG. 12A, another winding 45 outside of the vertical stack of windings 44 but in the horizontal plane of the bottom solenoidal winding 44b may be added, provided the additional winding 45 is close to the bottom solenoidal winding 44b.

Referring specifically now to the preferred dual solenoid embodiment of FIG. 13, a second outer vertical stack or solenoid 90 of windings 92 at an outer location (i.e., against the outer circumferential surface of the thermally conductive torus 75) is displaced by a radial distance δR from the inner vertical stack of solenoidal windings 44. Note that in FIG. 13 confinement of the inner solenoidal antenna 42 to the center and the outer solenoidal antenna 90 to the periphery leaves a large portion of the top surface of the ceiling 52 available for direct contact with the temperature control apparatus 72, 74, 75, as in FIG. 12A. An advantage is that the larger surface area contact between the ceiling 52 and the temperature control apparatus provides a more efficient and more uniform temperature control of the ceiling 52.

For a reactor in which the side wall 50 and ceiling 52 are formed of a single piece of silicon for example with an inside diameter of 12.6 inches (32 cm), the antenna-to-workpiece gap is 3 inches (7.5 cm), and the mean diameter of the inner solenoid is 3.75 inches (9.3 cm) while the mean diameter of the outer solenoid is 11.75 inches(29.3 cm) using 3/16 inch diameter hollow copper tubing covered with a 0.03 inch thick Teflon insulation layer, each solenoid consisting of four turns and being 1 inch (2.54 cm) high. The outer stack or solenoid 90 is energized by a second independently controllable plasma source RF power supply 96. The purpose is to permit different user-selectable plasma source power levels to be applied at different radial locations relative to the workpiece or wafer 56 to permit compensation for known processing non-uniformities across the wafer surface, a significant advantage. In combination with the independently controllable center gas feed 64a and peripheral gas feeds 64b–d, etch performance at the workpiece center may be adjusted relative to etch performance at the edge by adjusting the RF power applied to the inner solenoid 42 relative to that applied to the outer solenoid 90 and adjusting the gas flow rate through the center gas feed 64a relative to the flow rate through the outer gas feeds 64b–d. While the present invention solves or at least ameliorates the problem of a center null or dip in the inductance field as described above, there may be other plasma processing non-uniformity problems, and these can be compensated in the versatile embodiment of FIG. 13 by adjusting the relative RF power levels applied to the inner and outer antennas 42, 90. For effecting this purpose with greater convenience, the respective RF power supplies 68, 96 for the inner and outer solenoids 42, 90 may be replaced by a common power supply 97a and a power splitter 97b which permits the user to change the relative apportionment of power between the inner and outer solenoids 42, 90 while preserving a fixed phase relationship between the fields of the inner and outer solenoids 42, 90. This is particularly important where the two solenoids 42, 90 receive RF power at the same frequency. Otherwise, if the two independent power supplies 68, 96 are employed, then they may be powered at different RF frequencies, in which case it is preferable to install RF filters at the output of each RF power supply 68, 96 to avoid off-frequency feedback from coupling between the two solenoids. In this case, the frequency difference should be sufficient to time-average out coupling between the two solenoids and, furthermore, should exceed the rejection bandwidth of the RF filters. Another option is to make each frequency independently resonantly matched to the respective solenoid, and each frequency may be varied to follow changes in the plasma impedance (thereby maintaining resonance) in lieu of conventional impedance matching techniques. In other words, the RF frequency applied to the antenna is made to follow the resonant frequency of the antenna as loaded by the impedance of the plasma in the chamber. In such implementations, the frequency ranges of the two solenoids should be mutually exclusive. Preferably, however, the two solenoids are driven at the same RF frequency and in this case it is preferable that the phase relationship between the two be such as to cause constructive interaction or superposition of the fields of the two solenoids. Generally, this requirement will be met by a zero phase angle between the signals applied to the two solenoids if they are both wound in the same sense. Otherwise, if they are oppositely wound, the phase angle is preferably 180E. In any case, coupling between the inner and outer solenoids can be minimized or eliminated by having a relatively large space between the inner and outer solenoids 42, 90, as will be discussed below in this specification.

The range attainable by such adjustments is increased by increasing the radius of the outer solenoid 90 to increase the spacing between the inner and outer solenoids 42, 90, so that the effects of the two solenoids 42, 90 are more confined to the workpiece center and edge, respectively. This permits a greater range of control in superimposing the effects of the two solenoids 42, 90. For example, the radius of the inner solenoid 42 should be no greater than about half the workpiece radius and preferably no more than about a third thereof. The minimum radius of the inner solenoid 42 is affected in part by the diameter of the conductor forming the solenoid 42 and in part by the need to provide a finite non-zero circumference for an arcuate—e.g., circular—current path to produce inductance. The radius of the outer coil 90 should be at least equal to the workpiece radius and preferably 1.5 or more times the workpiece radius. With such a configuration, the respective center and edge effects of the inner and outer solenoids 42, 90 are so pronounced that by increasing power to the inner solenoid the chamber pressure can be raised into the hundreds of millitorr while providing a uniform plasma, and by increasing power to the outer solenoid 90 the chamber pressure can be reduced to on the order of 0.01 mT while providing a uniform plasma. Another advantage of Such a large radius of the outer solenoid 90 is that it minimizes coupling between the inner and outer solenoids 42, 90.

FIG. 13 indicates in dashed line that a third solenoid 94 may be added as an option, which is desirable for a very large chamber diameter.

Figure 14:
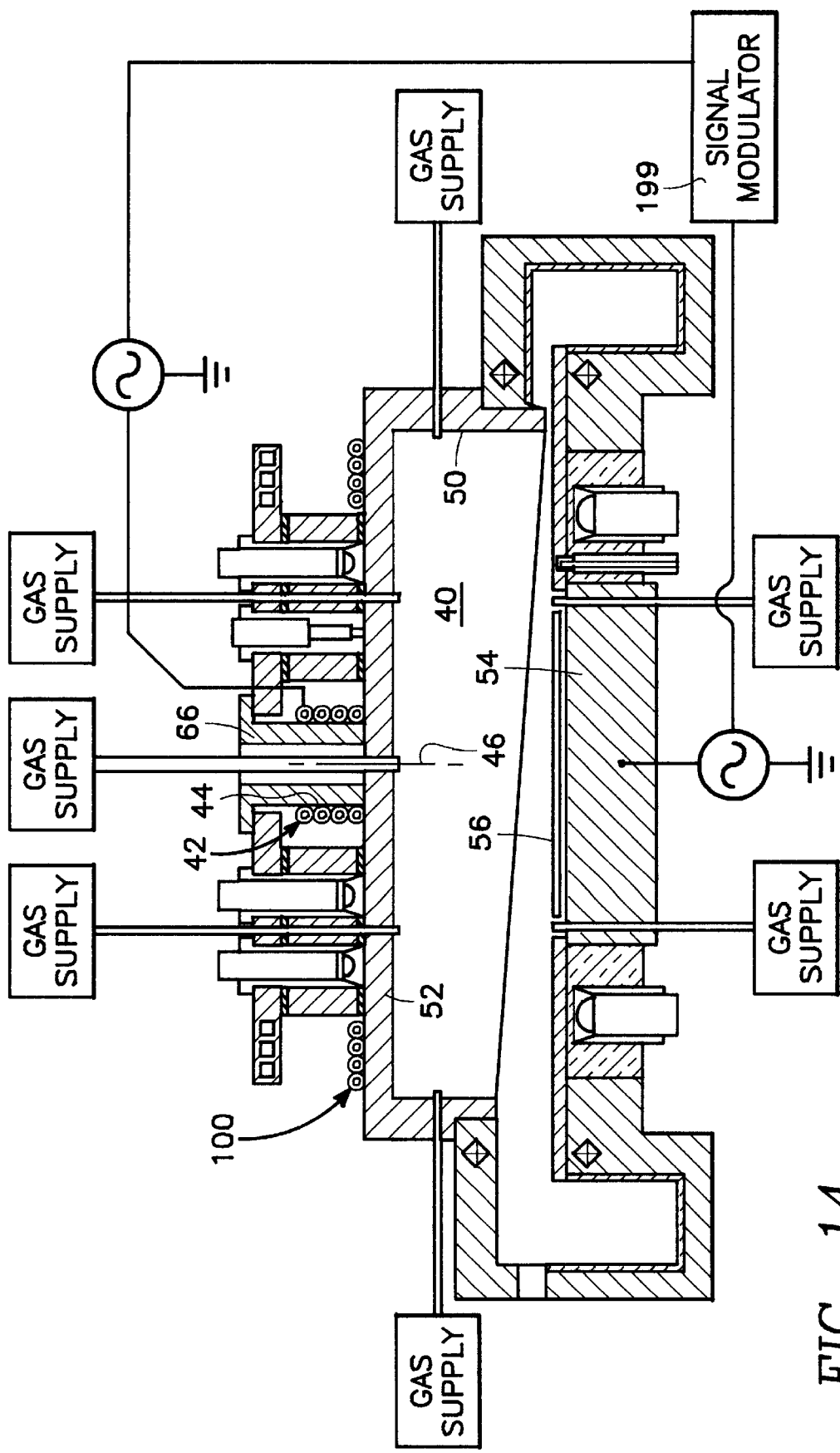
FIG. 14 is a cut-away side view of a plasma reactor in accordance with a second alternative embodiment of the invention corresponding to FIG. 13 in which the outer winding is flat.

FIG. 14 illustrates a variation of the embodiment of FIG. 13 in which the outer solenoid 90 is replaced by a planar winding 100.

Figure 15:
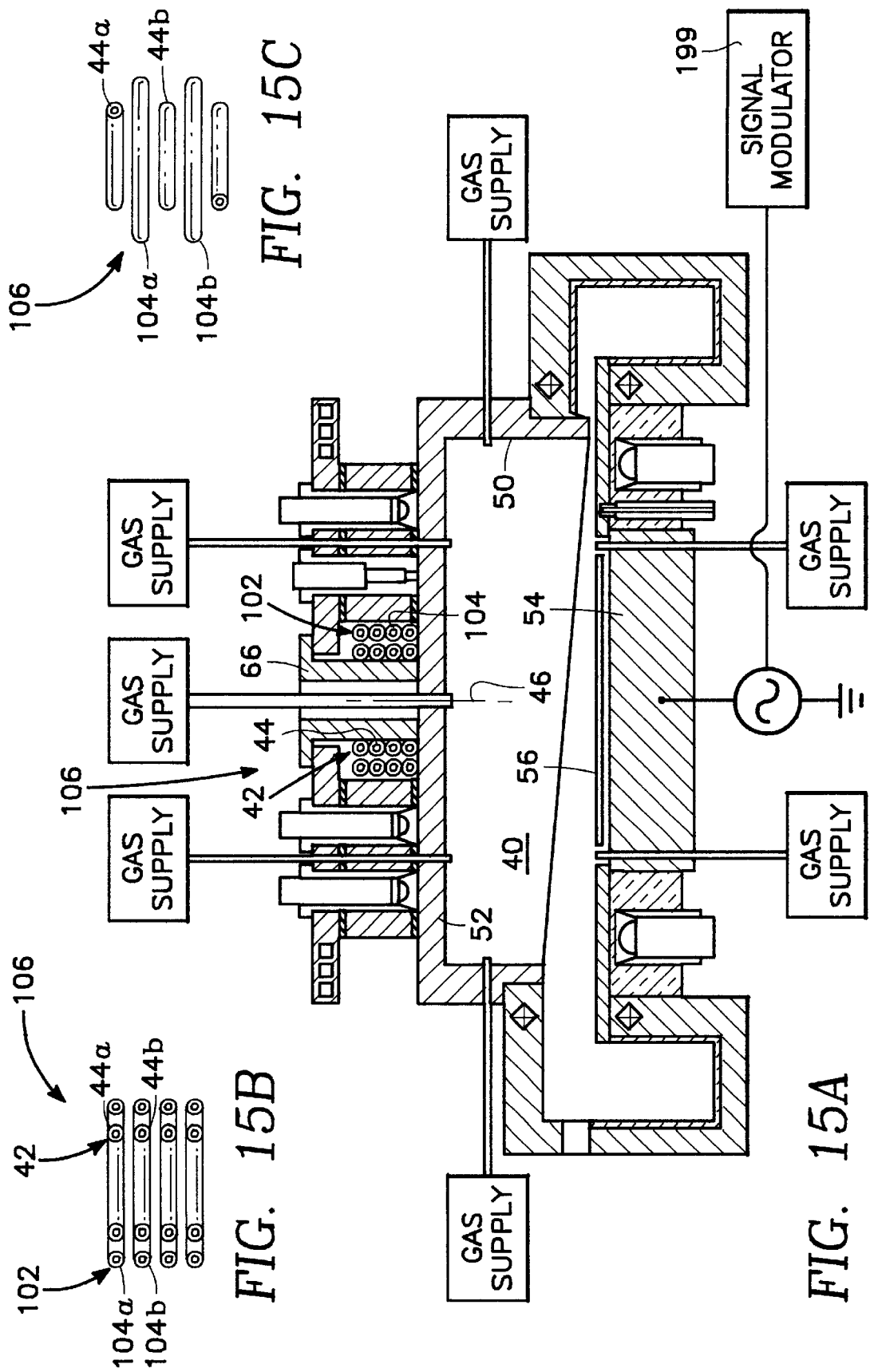
FIG. 15A is a cut-away side view of a plasma reactor in accordance with a third alternative embodiment of the present invention corresponding to FIG. 12A in which the center solenoid winding consists of plural upright cylindrical windings.
FIG. 15B is a detailed view of a first implementation of the embodiment of FIG. 15A.
FIG. 15C is a detailed view of a second implementation of the embodiment of FIG. 15A.

FIG. 15A illustrates a variation of the embodiment of FIG. 12A in which the center solenoidal winding includes not only the vertical stack 42 of windings 44 but in addition a second vertical stack 102 of windings 104 closely adjacent to the first stack 42 so that the two stacks constitute a double-wound solenoid 106. Referring to FIG. 15B, the doubly wound solenoid 106 may consist of two independently wound single solenoids 42, 102, the inner solenoid 42 consisting of the windings 44a, 44b, and so forth and the outer solenoid 102 consisting of the winding 104a, 104b and so forth. Alternatively, referring to FIG. 15C, the doubly wound solenoid 106 may consist of vertically stacked pairs of at least nearly co-planar windings. In the alternative of FIG. 15C, each pair of nearly co-planar windings (e.g., the pair 44a, 104a or the pair 44b, 104b) may be formed by helically winding a single conductor. The term "doubly wound" used herein refers to winding of the type shown in either FIG. 15B or 15C. In addition, the solenoid winding may not be merely doubly wound but may be triply wound or more and in general it can consists of plural windings at each plane along the axis of symmetry. Such multiple-wound solenoids may be employed in either one or both the inner and outer solenoids 42, 90 of the dual-solenoid embodiment of FIG. 13.

Figure 16:
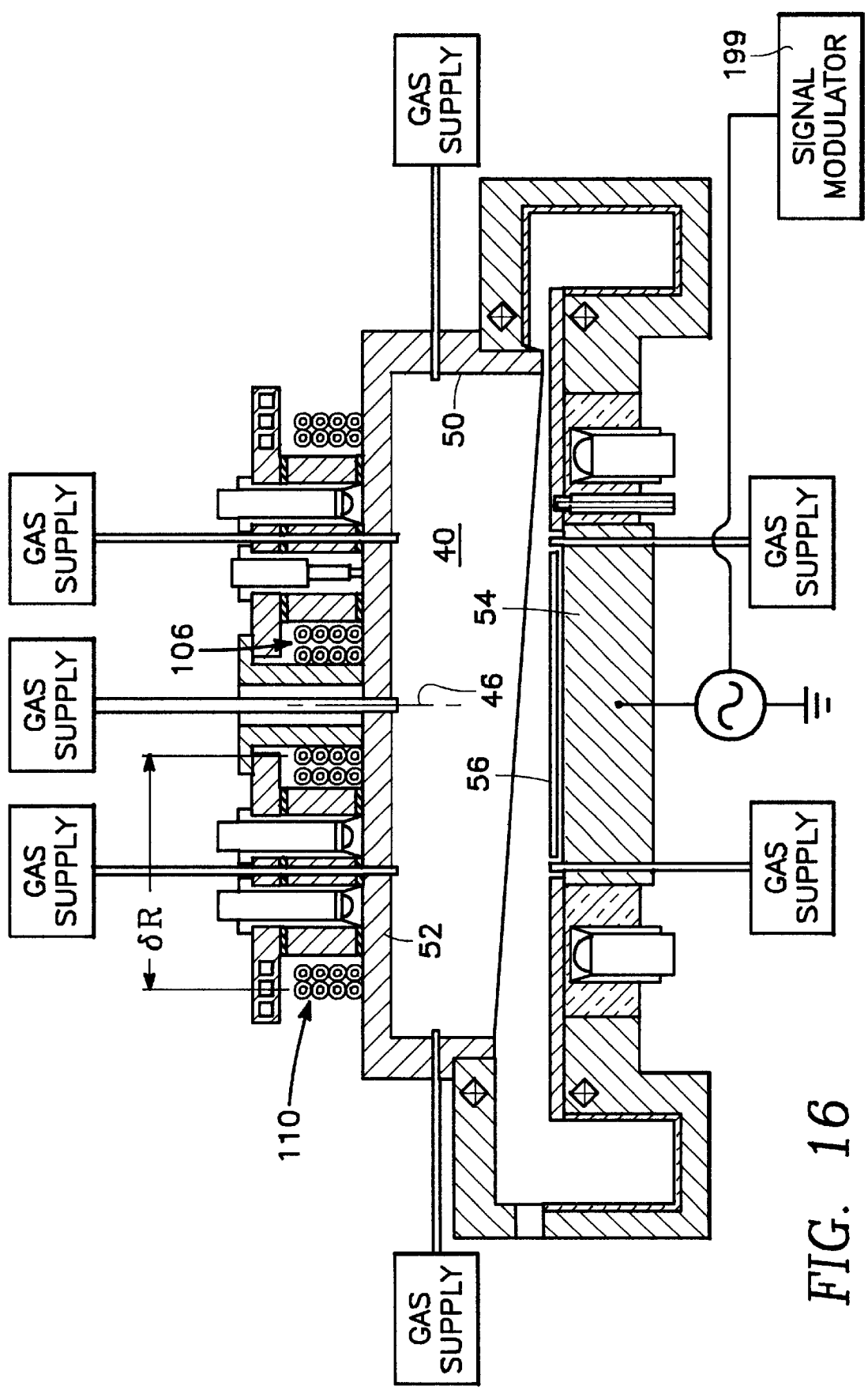
FIG. 16 is a cut-away side view of a plasma reactor in accordance with a fourth alternative embodiment of the present invention corresponding to FIG. 13 in which both the inner and outer windings consist of plural upright cylindrical windings.

FIG. 16 illustrates a variation of the embodiment of FIG. 15A in which an outer doubly wound solenoid 110 concentric with the inner doubly wound solenoid 106 is placed at a radial distance δR from the inner solenoid 106.

Figure 17:
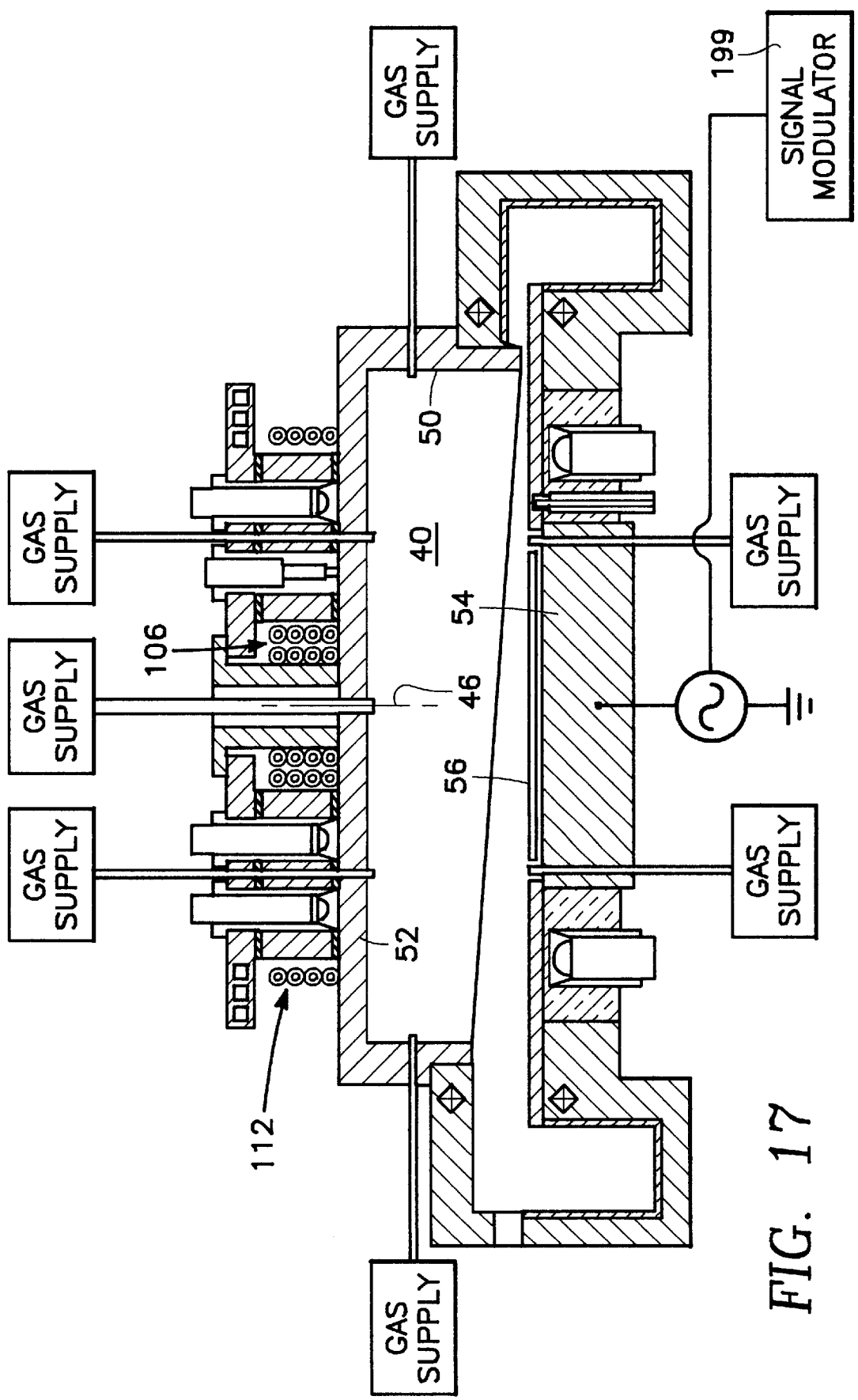
FIG. 17 is a cut-away side view of a plasma reactor in accordance with a fifth alternative embodiment of the present invention corresponding to FIG. 13 in which the inner winding consists of plural upright cylindrical windings and the outer winding consists of a single upright cylindrical winding.

FIG. 17 illustrates a variation of the embodiment of FIG. 16 in which the outer doubly wound solenoid 110 is replaced by an ordinary outer solenoid 112 corresponding to the outer solenoid employed in the embodiment of FIG. 13.

Figure 18:
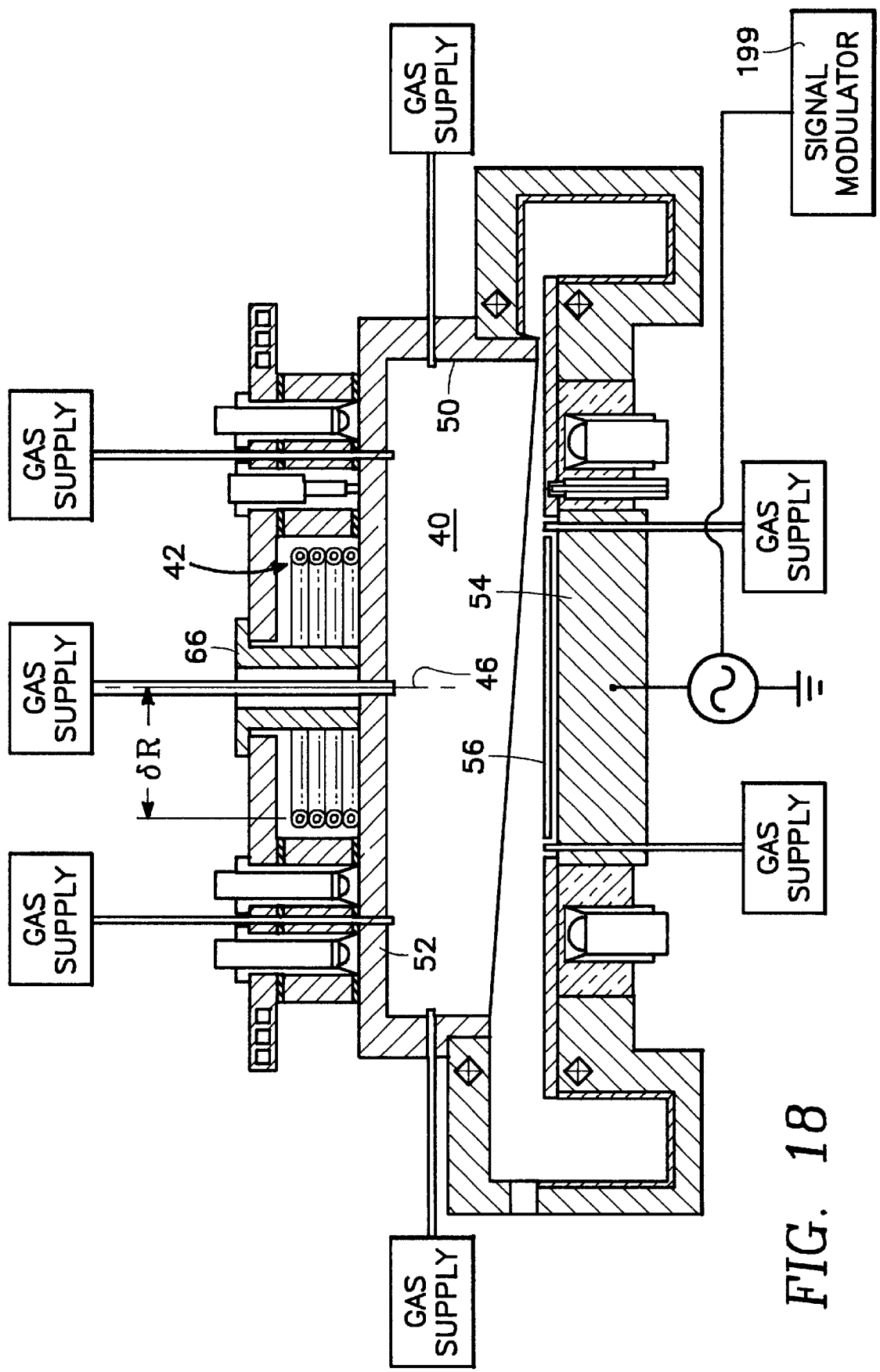
FIG. 18 is a cut-away side view of a plasma reactor in accordance with a sixth alternative embodiment of the present invention in which a single solenoid winding is placed at an optimum radial position for maximum plasma ion density uniformity.

FIG. 18 illustrates another preferred embodiment in which the solenoid 42 of FIG. 13 is placed at a location displaced by a radial distance δR from the center gas feed housing 66. In the embodiment of FIG. 12A, δR is zero while in the embodiment of FIG. 18 δR is a significant fraction of the radius of the cylindrical side wall 50. Increasing δR to the extent illustrated in FIG. 18 may be helpful as an alternative to the embodiments of FIGS. 12A, 13, 15A and 16 for compensating for non-uniformities in addition to the usual center null in plasma ion density described earlier. Similarly, the embodiment of FIG. 18 may be helpful where placing the solenoid 42 at the minimum distance from the chamber center axis 46 (as in FIG. 12) would so increase the plasma ion density near the center of the wafer 56 as to over-correct for the usual dip in plasma ion density near the center and create yet another non-uniformity in the plasma process behavior. In such a case, the embodiment of FIG. 18 is preferred where δR is selected to be an optimum value which provides the greatest uniformity in plasma ion density. Ideally in this case, δR is selected to avoid both under-correction and over-correction for the usual center dip in plasma ion density. The determination of the optimum value for δR can be carried out by the skilled worker by trial and error steps of placing the solenoid 42 at different radial locations and employing conventional techniques to determine the radial profile of the plasma ion density at each step.

Figure 19:
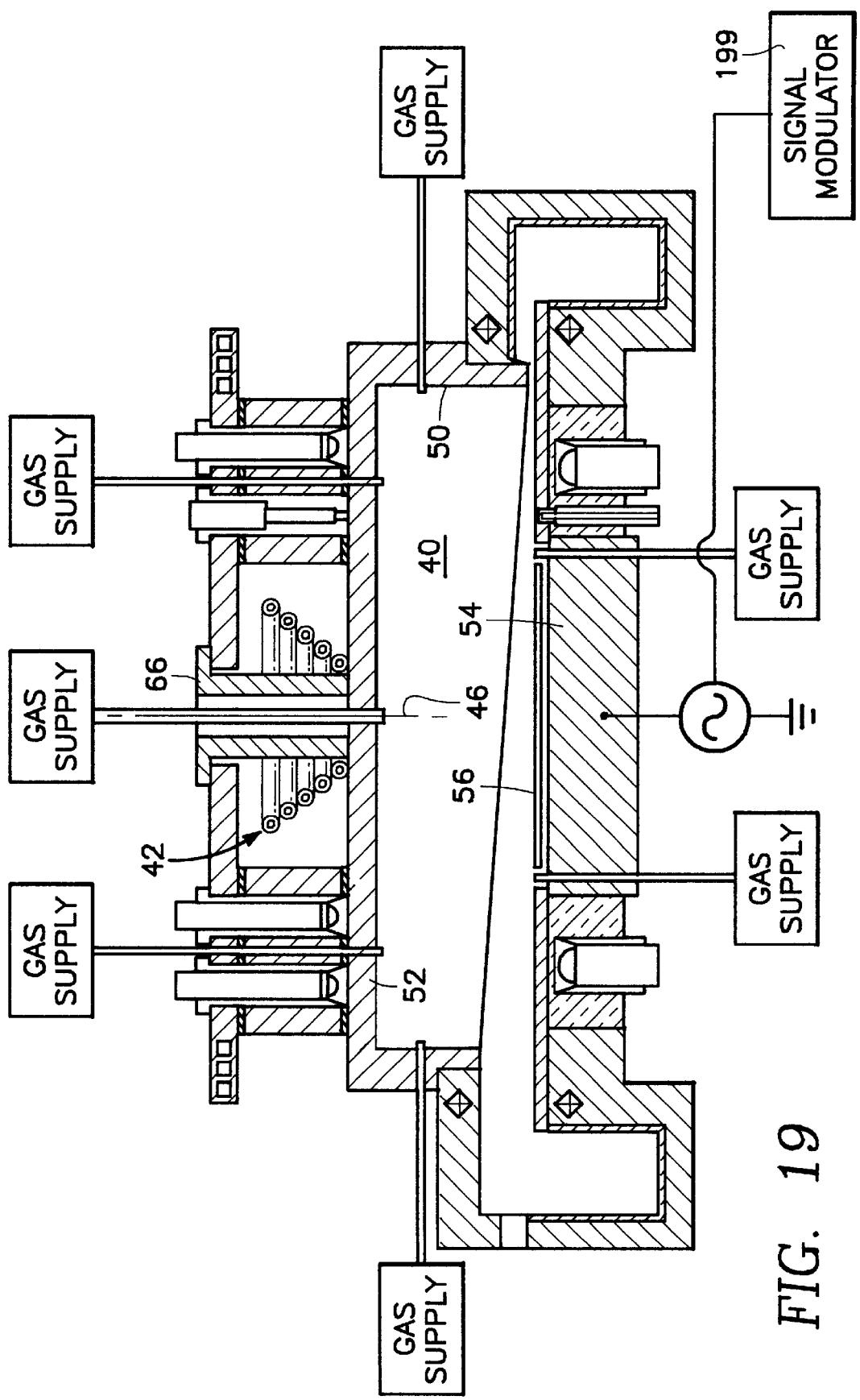
FIG. 19 is a cut-away side view of a plasma reactor in accordance with a seventh alternative embodiment of the present invention corresponding to FIG. 12A in which the solenoid winding is an inverted conical shape.
Figure 20:
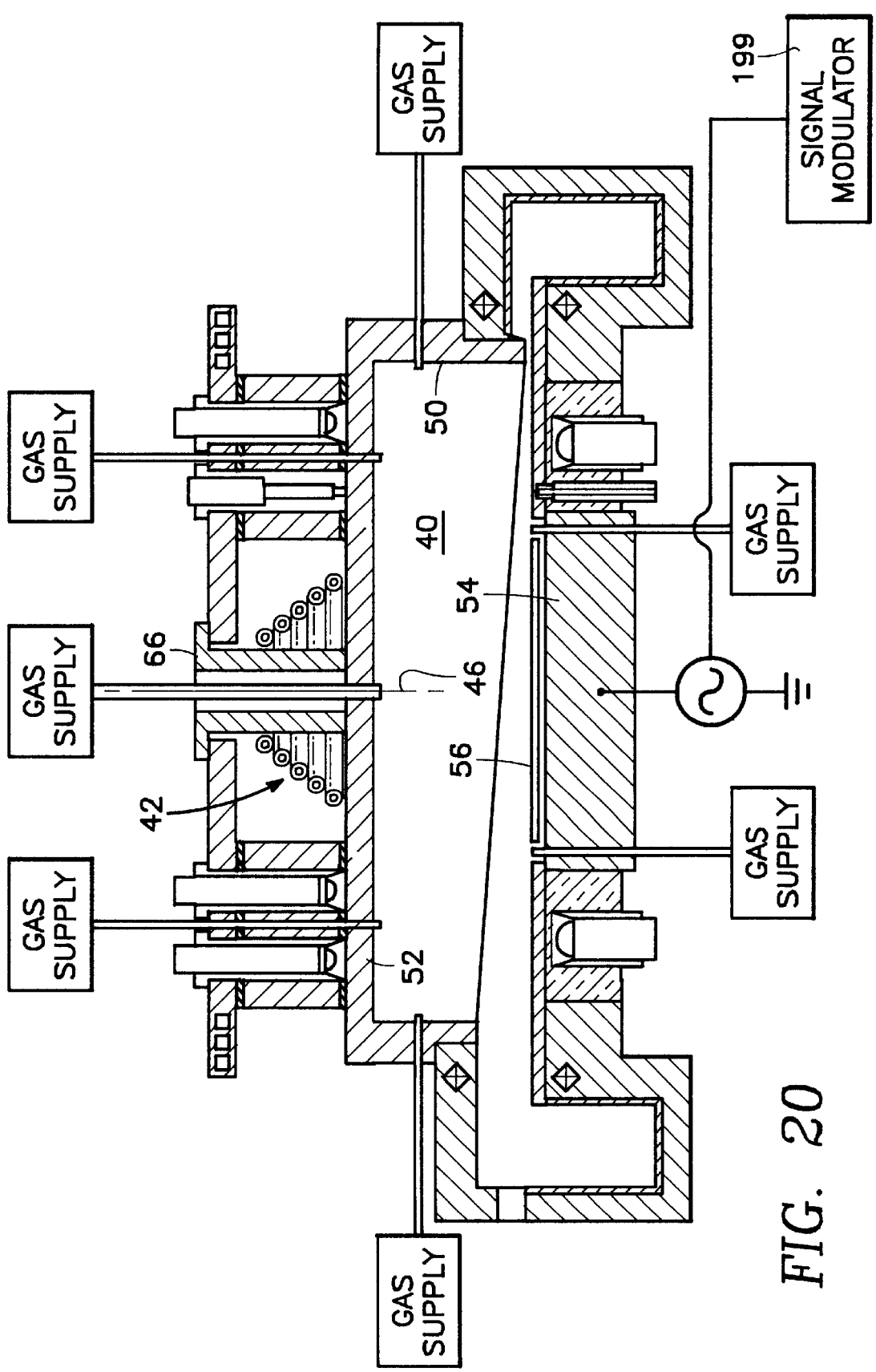
FIG. 20 is a cut-away side view of a plasma reactor in accordance with an eighth alternative embodiment of the present invention corresponding to FIG. 12A in which the solenoid winding is an upright conical shape.

FIG. 19 illustrates an embodiment in which the solenoid 42 has an inverted conical shape while FIG. 20 illustrates an embodiment in which the solenoid 42 has an upright conical shape.

Figure 21:
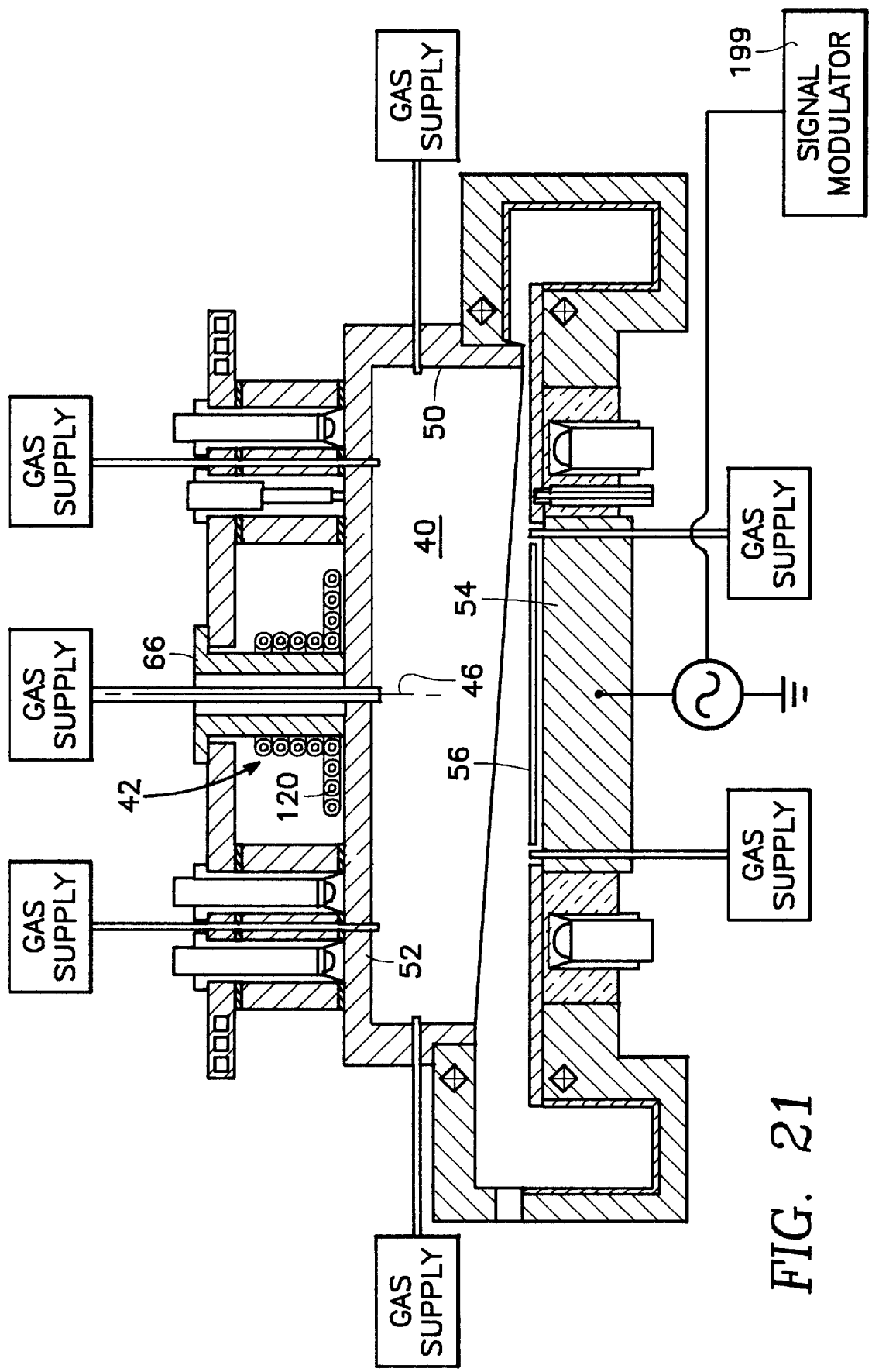
FIG. 21 is a cut-away side view of a plasma reactor in accordance with a ninth alternative embodiment of the present invention corresponding to FIG. 12A in which the solenoid winding consists of an inner upright cylindrical portion and an outer flat portion.
Figure 22:
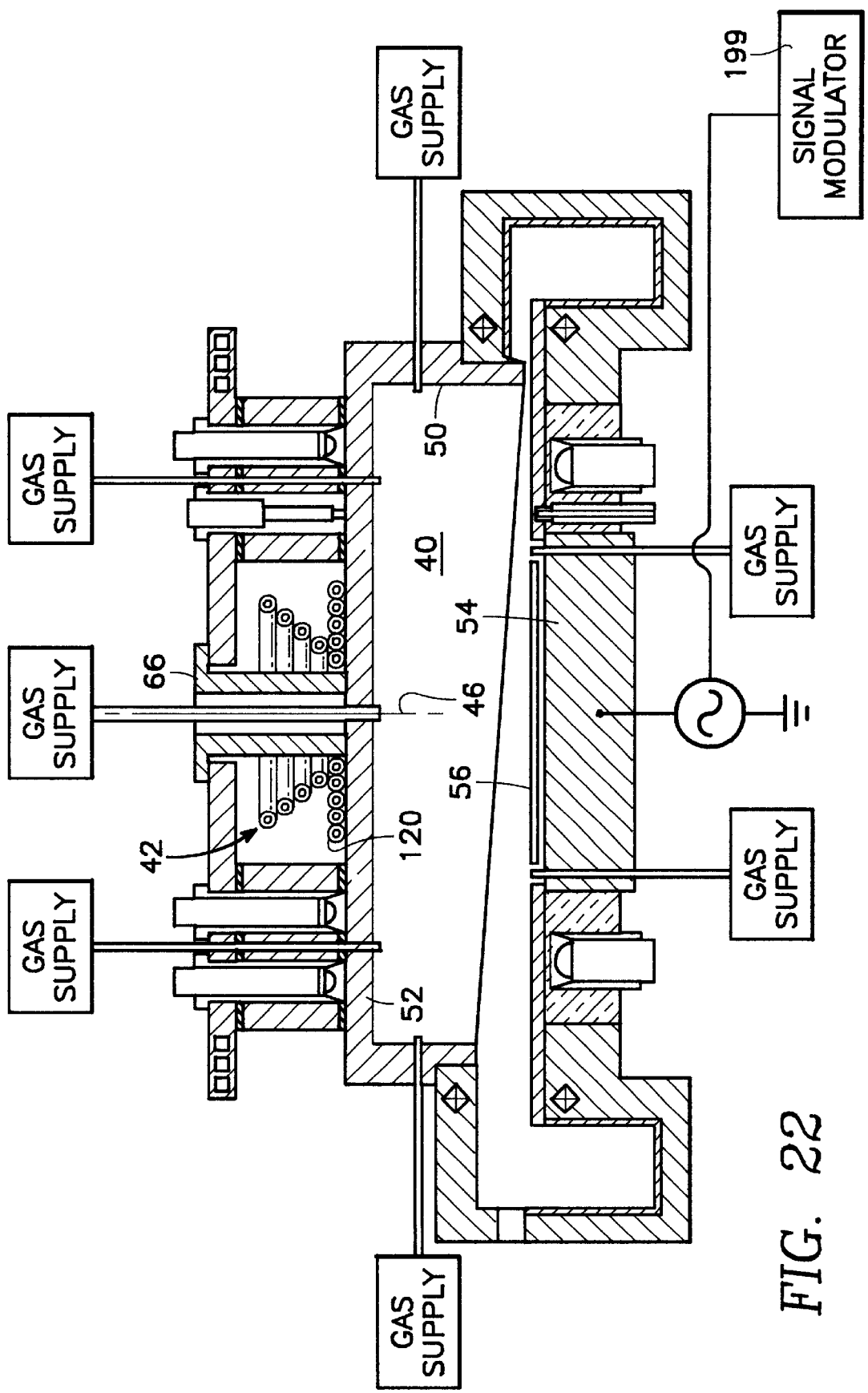
FIG. 22 is a cut-away side view of a plasma reactor in accordance with a tenth alternative embodiment of the present invention corresponding to FIG. 18 in which the solenoid winding includes both an inverted conical portion and a flat portion.
Figure 23:
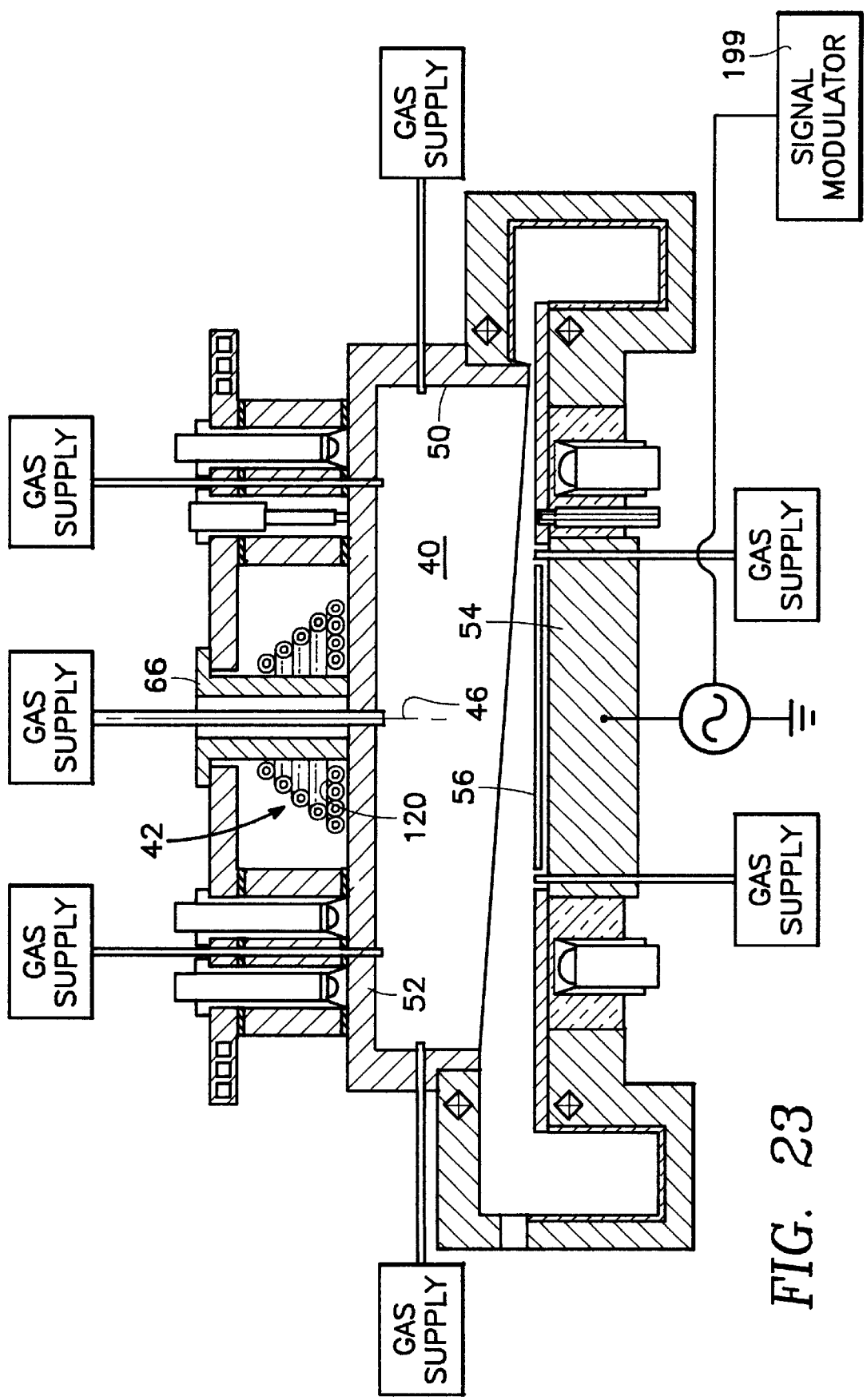
FIG. 23 is a cut-away side view of a plasma reactor in accordance with an eleventh alternative embodiment of the present invention corresponding to FIG. 20 in which the solenoid winding includes both an upright conical portion and a flat portion.

FIG. 21 illustrates an embodiment in which the solenoid 42 is combined with a planar helical winding 120. The planar helical winding has the effect of reducing the severity with which the solenoid winding 42 concentrates the induction field near the center of the workpiece by distributing some of the RF power somewhat away from the center. This feature may be useful in cases where it is necessary to avoid overcorrecting for the usual center null. The extent of such diversion of the induction field away from the center corresponds to the radius of the planar helical winding 120. FIG. 22 illustrates a variation of the embodiment of FIG. 21 in which the solenoid 42 has an inverted conical shape as in FIG. 19. FIG. 23 illustrates another variation of the embodiment of FIG. 21 in which the solenoid 42 has an upright conical shape as in the embodiment of FIG. 20.

Figure 24:
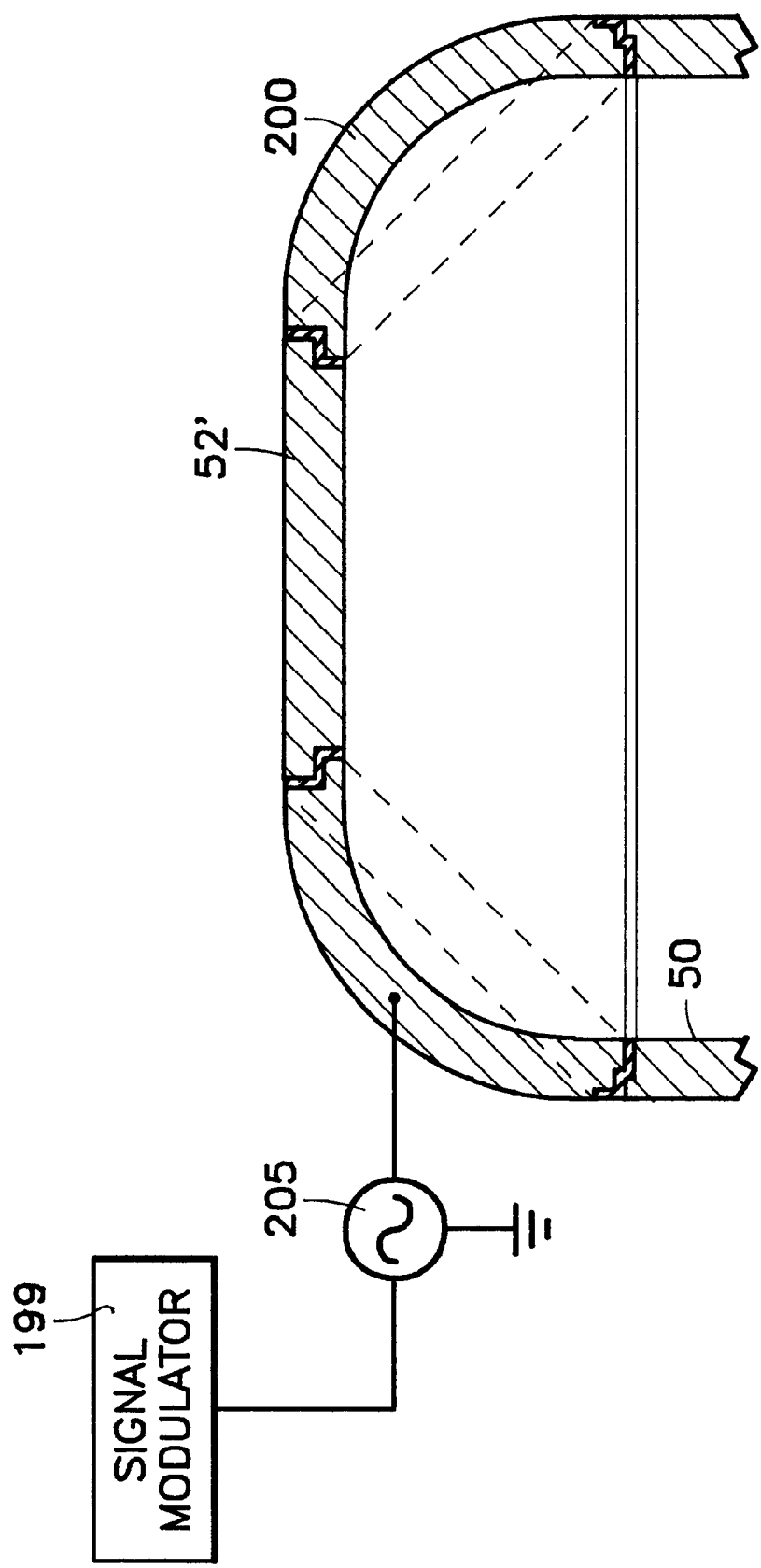
FIG. 24 illustrates another embodiment of the present invention employing a combination of planar, conical and domeshaped ceiling elements.

The RF potential on the ceiling 52 may be increased, for example to prevent polymer deposition thereon, by reducing its effective capacitive electrode area relative to other electrodes of the chamber (e.g., the workpiece and the sidewalls). FIG. 24 illustrates how this can be accomplished by supporting a smaller-area version of the ceiling 52' on an outer annulus 200, from which the smaller-area ceiling 52' is insulated. The annulus 200 may be formed of the same material (e.g., silicon) as the ceiling 52' and may be of a truncated conical shape (indicated in solid line) or a truncated dome shape (indicated in dashed line). A separate RF power supply 205 may be connected to the annulus 200 to permit more workpiece center versus edge process adjustments.

Figure 25A:
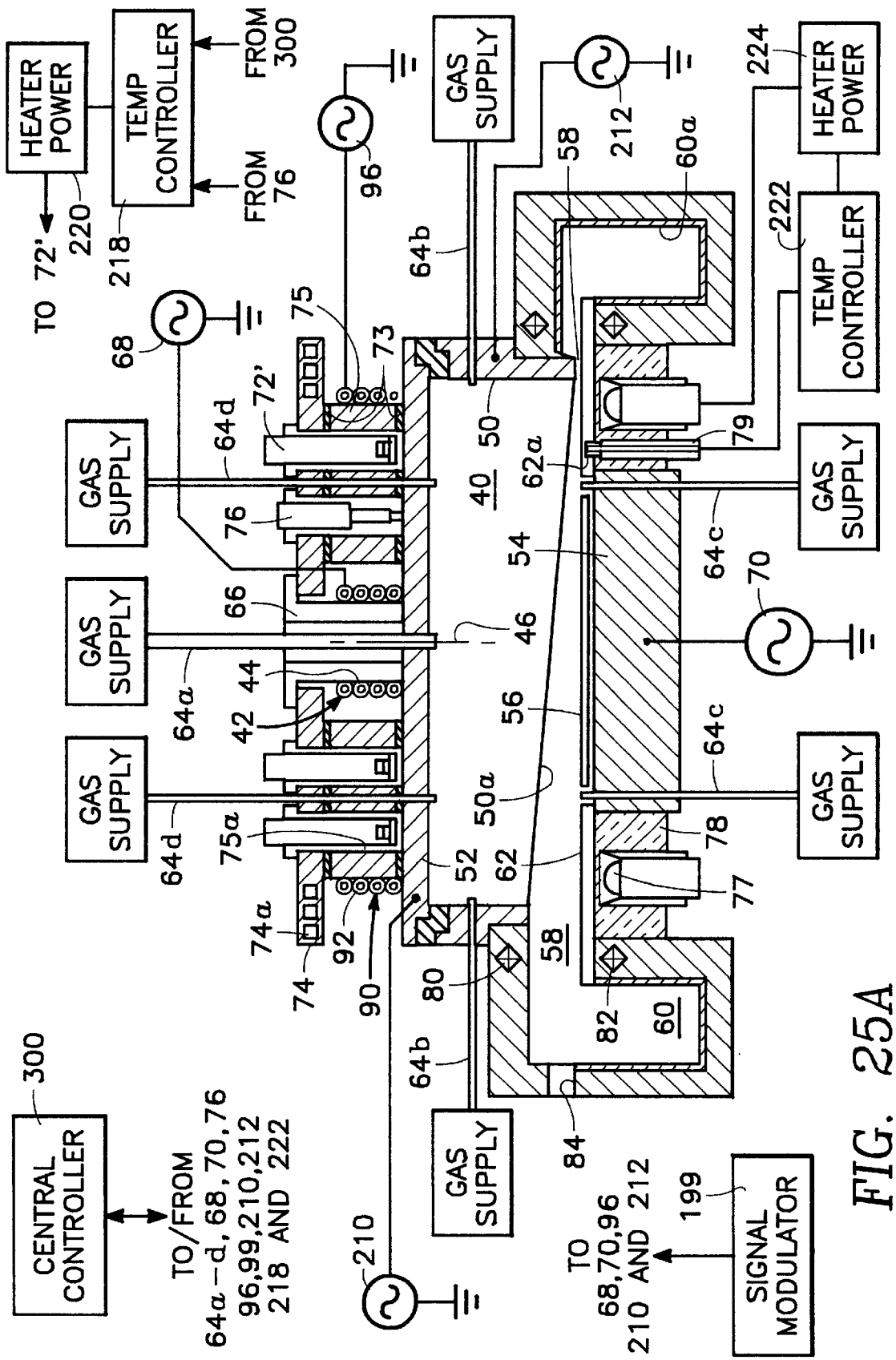
FIG. 25A illustrates an alternative embodiment of the present invention employing a separately biased silicon side wall and ceiling and employing electrical heaters.

FIG. 25A illustrates a variation of the embodiment of FIG. 13 in which the ceiling 52 and side wall 50 are separate semiconductor (e.g., silicon) pieces insulated from one another having separately controlled RF bias power levels applied to them from respective RF sources 210, 212 to enhance control over the center etch rate and selectivity relative to the edge. As set forth in greater detail in above-referenced U.S. application Ser. No. 08/597,577 filed Feb. 2, 1996 by Kenneth S. Collins et al., the ceiling 52 may be a semiconductor (e.g., silicon) material doped so that it will act as an electrode capacitively coupling the RF bias power applied to it into the chamber 40 and simultaneously as a window through which RF power applied to the solenoid 42 may be inductively coupled into the chamber 40. The advantage of such a window-electrode is that an RF potential may be established directly over the wafer 56 (e.g., for controlling ion energy) while at the same time inductively coupling RF power directly over the wafer 56. This latter feature, in combination with the separately controlled inner and outer solenoids 42, 90 and center and peripheral gas feeds 64a, 64b–d greatly enhances the ability to adjust various plasma process parameters such as ion density, ion energy, etch rate and etch selectivity at the workpiece center relative to the workpiece edge to achieve an optimum uniformity. In this combination, the respective gas flow rates through individual gas feeds are individually and separately controlled to achieve such optimum uniformity of plasma process parameters.

FIG. 25A illustrates how the lamp heaters 72 may be replaced by electric heating elements 72'. As in the embodiment of FIG. 12A, the disposable silicon member is an annular ring 62 surrounding the workpiece support 54.

Figure 25B:
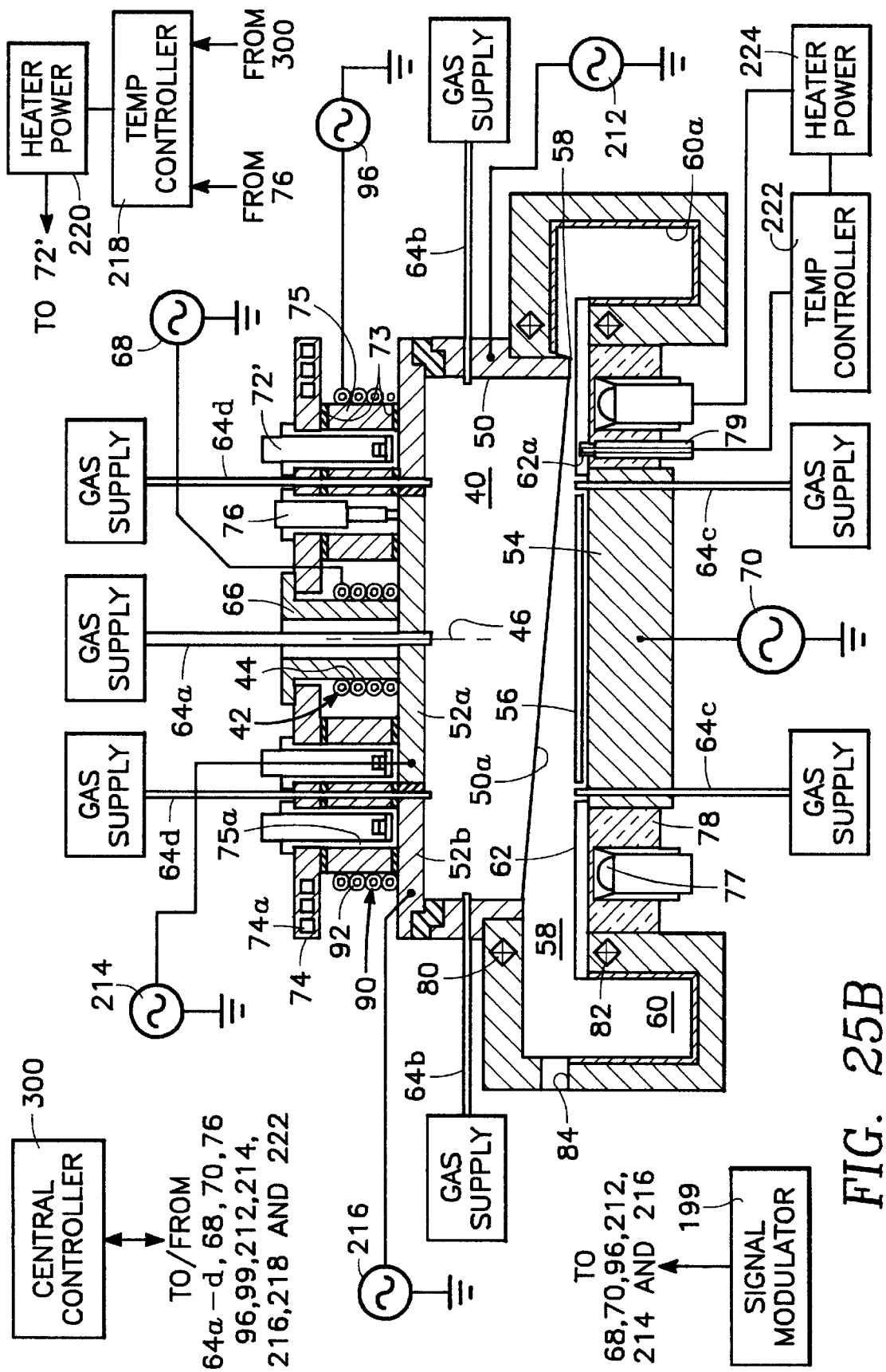
FIG. 25B illustrates an alternative embodiment of the present invention employing separately biased inner and outer silicon ceiling portions and employing electrical heaters.

FIG. 25B illustrates another variation in which the ceiling 52 itself may be divided into an inner disk 52a and an outer annulus 52b electrically insulated from one another and separately biased by independent RF power sources 214, 216 which may be separate outputs of a single differentially controlled RF power source.

In accordance with an alternative embodiment, a user-accessible central controller 300 shown in FIGS. 25A and 25B, such as a programmable electronic controller including, for example, a conventional microprocessor and memory, is connected to simultaneously control gas flow rates through the central gas feed 64a and the peripheral gas feeds 64b–d, RF plasma source power levels applied to the inner and outer antennas 42, 90 and RF bias power levels applied to the ceiling 52 and side wall 50 respectively (in FIG. 25A) and the RF bias power levels applied to the inner and outer ceiling portions 52a, 52b (in FIG. 25B), temperature of the ceiling 52 and the temperature of the silicon ring 62. A ceiling temperature controller 218 governs the power applied by a power source 220 to the heaters 72' by comparing the temperature measured by the ceiling temperature sensor 76 with a desired temperature known to the controller 300. A ring temperature controller 222 controls the power applied by a heater power source 224 to the heater lamps 77 facing the silicon ring 62 by comparing the ring temperature measured by the ring sensor 79 with a desired ring temperature stored known to the controller 222. The master controller 300 governs the desired temperatures of the temperature controllers 218 and 222, the RF power levels of the solenoid power sources 68, 96, the RF power levels of the bias power sources 210, 212 (FIG. 25A) or 214, 216 (FIG. 25B), the wafer bias level applied by the RF power source 70 and the gas flow rates supplied by the various gas supplies (or separate valves) to the gas inlets 64a–d. The key to controlling the wafer bias level is the RF potential difference between the workpiece support 54 and the ceiling 52. Thus, either the workpiece support RF power source 70 or the ceiling RF power source 210 may be simply a short to RF ground. With such a programmable integrated controller, the user can easily optimize apportionment of RF source power, RF bias power and gas flow rate between the workpiece center and periphery to achieve the greatest center-to-edge process uniformity across the surface of the workpiece (e.g., uniform radial distribution of etch rate and etch selectivity). Also, by adjusting (through the controller 300) the RF power applied to the solenoids 42, 90 relative to the RF power difference between the workpiece support 54 and ceiling 52, the user can operate the reactor in a predominantly inductively coupled mode or in a predominantly capacitively coupled mode.

While the various power sources connected in FIG. 25A to the solenoids 42, 90, the ceiling 52, side wall 50 (or the inner and outer ceiling portions 52a, 52b as in FIG. 25B) have been described as operating at RF frequencies, the invention is not restricted to any particular range of frequencies, and frequencies other than RF may be selected by the skilled worker in carrying out the invention.

In a preferred embodiment of the invention, the high thermal conductivity spacer 75, the ceiling 52 and the side wall 50 are integrally formed together from a single piece of crystalline silicon.

While the invention has been described as being carried out with a number of separate RF sources, some or all of the RF sources depicted herein may derive their outputs from separate RF generators or from a common RF generator with different outputs at different RF power levels, frequencies and phases synthesized with variable power dividers, frequency multipliers and/or phase delays, as may be appropriate. Moreover, while the invention has been described as being carried out with a number of separate process gas supplies, some or all of the process gas supplies may be derived from a common process gas supply which is divided among the plural separately controlled gas inlets 64.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of processing a workpiece, comprising:
   (a) providing an inductively coupled plasma reactor comprising a reactor chamber having an interior surface and reactor walls, a workpiece support for holding the workpiece, a ceiling overlying the workpiece support and adjacent the reactor walls and an RF applicator adapted to couple power from a power source into the reactor chamber, wherein the interior surface of the reactor chamber and the ceiling are comprised of a non-metallic material;
   (b) irradiating a process gas within the reactor chamber with an energy emission from the RF applicator to generate a plasma containing species;
   (c) modulating the energy emission with a first modulating signal so as to control the density of the species generated;
   wherein the first modulating signal comprises a first on-time region and a first off-time region;
   wherein modulating the energy emission comprises adjusting a duration of at least one of:
      (a) the first on-time region;
      (b) the first off-time region;
   wherein modulating the energy emission further comprises modulating at least one of: the power source, a current of the RF applicator, a rate of change of the current from the RF applicator; and
   wherein modulating further comprises modulating the power source and adjusting a power level of the power source such that an average power of the power source is constant.

2. The invention as set forth in claim 1, wherein the density of the species generated is represented by a ratio of bigger species to smaller species.

3. The invention as set forth in claim 2, wherein the ratio of bigger species to smaller species is between approximately 0.25 and 5.

4. The invention as set forth in claim 1, wherein the non-metallic material comprises a semiconductor material.

5. The invention as set forth in claim 4, wherein the semiconductor material comprises silicon.

6. The invention as set forth in claim 1, wherein the energy emission is zero during a greater part of the off-time duration.

7. The invention as set forth in claim 1, wherein the energy emission during the off-time duration is greater than zero and less than the energy emission during the on-time duration.

8. The invention as set forth in claim 1, further comprising keeping plasma density approximately constant while modulating the energy emission.

9. The invention as set forth in claim 1, wherein the power source comprises a RF power supply coupled to the RF applicator.

10. The invention as set forth in claim 1, wherein the RF applicator and the workpiece support are separated by a distance on the order of a skin depth in the plasma of an induction field of the RF applicator.

11. The invention as set forth in claim 1, further comprising:
providing a plasma reactor further comprising a bias source across the workpiece support, the bias source forming an electric field near the workpiece support; and
modulating the electric field with a second modulating signal.

12. The invention as set forth in claim 11, wherein the second modulating signal comprises a second on-time region and a second off-time region.

13. The invention as set forth in claim 12, wherein modulating the electric field comprises adjusting a duration of at least one of: (a) the second on-time region; (b) the second off-time region.

14. The invention as set forth in claim 13, further comprising:
synchronizing the first modulating signal and the second modulating signal such that:
the first off-time region and the second on-time region occur when the plasma is at its substantially coolest temperature; and
the first on-time region and the second off-time region occur when the plasma is at its substantially hottest temperature.

15. The invention of claim 14, further comprising:
keeping plasma density approximately constant while modulating the energy emission and the electric field.

16. The invention as set forth in claim 13, wherein modulating the electric field further comprises modulating at least one of: (a) a power of the bias source; (b) a voltage of the bias source; (c) a current of the bias source; (d) a rate of change of the current of the bias source.

17. A method of processing a workpiece, comprising:
(a) providing an inductively couple plasma reactor comprising a reactor chamber, a workpiece support for holding the workpiece near a support plane inside the reactor chamber, a reactor enclosure portion facing the workpiece support, and an RF applicator adjacent the reactor enclosure portion, the RF applicator comprising inductive elements and being adapted to couple power from a power source into the reactor chamber;
(b) irradiating a process gas within the reactor chamber with an energy emission from the RF applicator so as to produce a plasma containing species;
(c) modulating the energy emission with a first modulating signal so as to control the density of each of the species generated;
wherein the first modulating signal comprises a first on-time region and a first off-time region;
wherein modulating the energy emission comprises adjusting a duration of at least one of:
(a) the first on-time region;
(b) the first off-time region;
wherein modulating the energy emission further comprises modulating at least one of: the power source, a current of the RF applicator, a rate of change of the current from the RF applicator; and
wherein modulating further comprises modulating the power source and adjusting a power level of the power source such that an average power of the power source is constant.

18. The invention as set forth in claim 17, wherein the energy emission is zero during a greater part of the off-time duration.

19. The invention as set forth in claim 17, wherein the energy emission during the off-time duration is greater than zero and less than the energy emission during the on-time duration.

20. The invention as set forth in claim 17, further comprising keeping plasma density approximately constant while modulating the energy emission.

21. The invention as set forth in claim 17, wherein the inductive elements are spatially distributed so as to compensate for a null in a radiation pattern of the RF applicator.

22. The invention as set forth in claim 21, wherein the RF applicator comprises a solenoid non-planar inductive antenna.

23. The invention as set forth in claim 22, wherein the inductive elements comprise a vertical stack of conductive windings.

24. The invention as set forth in claim 23, wherein the non-planar inductive antenna has an axis of symmetry and the windings are at a minimum radial distance from the axis of symmetry.

25. The invention as set forth in claim 24, further comprising:
a second inductive antenna adjacent the reactor enclosure portion at an outer radial location relative to the solenoid antenna.

26. The invention as set forth in claim 23, wherein the windings are at a radial location corresponding to a substantial fraction of a radius of the reactor chamber.

27. The invention as set forth in claim 22, further comprising:
a second power source coupled to a second inductive antenna.

28. The invention as set forth in claim 27, where the second inductive antenna comprises a second non-planar inductive antenna.

29. The invention as set forth in claim 28, wherein the second non-planar inductive antenna comprises a solenoid antenna.

30. The invention as set forth in claim 23, wherein the vertical stack of conductive windings has a right cylindrical shape.

31. The invention as set forth in claim 23, wherein the vertical stack of conductive windings has an upright conical shape.

32. The invention as set forth in claim 23, wherein said vertical stack of conductive windings has an inverted conical shape.

33. The invention as set forth in claim 22, wherein the solenoid antenna comprises a doubly-wound solenoid winding.

34. The invention as set forth in claim 33, wherein said doubly wound solenoid winding comprises a pair of concentric single solenoid windings.

35. The invention as set forth in claim 33, wherein said doubly wound solenoid winding comprises a vertical stack of at least nearly planar pairs of windings.

36. The invention as set forth in claim 33, further comprising:
a second solenoid winding adjacent the reactor enclosure portion at an outer radial location relative to the doubly wound solenoid winding.

37. The invention as set forth in claim 36, further comprising:
a second power source coupled to the second solenoid winding.

38. The invention as set forth in claim 36, wherein the second solenoid winding comprises a doubly wound solenoid winding.

39. The invention as set forth in claim 23, further comprising a planar coil conductor extending radially outward from a bottom winding of the vertical stack of conductive windings.

40. The invention as set forth in claim 39, wherein said vertical stack of conductive windings has an upright conical shape.

41. The invention as set forth in claim 39, wherein the vertical stack of conductive windings has an inverted conical shape.

42. The invention as set forth in claim 17, wherein the power source comprises a RF power supply coupled to the inductive elements.

43. The invention as set forth in claim 17, wherein the RF applicator has a shape that is non-conformal with the reactor enclosure portion, and the non-conformal shape has a pitch away from the support plane exceeding that of the reactor enclosure portion.

44. The invention as set forth in claim 43, wherein:
the reactor enclosure portion comprises a ceiling of the reactor chamber overlying the workpiece support; and
the non-conformal shape of the inductive elements has a vertical pitch exceeding a vertical pitch of the ceiling.

45. The invention as set forth in claim 44, wherein the ceiling has a shape comprising one of: (a) planar; (b) dome; (c) conical; (d) truncated conical.

46. The invention as set forth in claim 17, wherein the RF applicator and the workpiece support are separated by a distance on the order of a skin depth in the plasma of an induction field of the RF applicator.

47. The invention as set forth in claim 17 further comprising:
providing a plasma reactor further comprising a bias source across the workpiece support, the bias source forming an electric field near the workpiece support; and
modulating the electric field with a second modulating signal.

48. The invention as set forth in claim 47, wherein the second modulating signal comprises a second on-time region and a second off-time region.

49. The invention as set forth in claim 48, wherein modulating the electric field comprises adjusting a duration of at least one of: (a) the second on-time region; (b) the second off-time region.

50. The invention as set forth in claim 49, wherein modulating the electric field further comprises modulating at least one of: (a) a power of the bias source; (b) a voltage of the bias source; (c) a current of the bias source; (d) a rate of change of the current of the bias source.

51. The invention as set forth in claim 49, further comprising:
synchronizing the first modulating signal and the second modulating signal such that:
the first off-time region and the second on-time region occur when the plasma is at its substantially coolest temperature; and
the first on-time region and the second off-time region occur when the plasma is at its substantially hottest temperature.

52. The invention of claim 51, further comprising:
keeping plasma density approximately constant while modulating the energy emission and the electric field.

53. A method of processing a workpiece, comprising:
(a) providing an inductively coupled plasma reactor comprising a reactor chamber, a workpiece support for holding the workpiece near a support plane inside the reactor chamber during processing, a reactor enclosure portion facing the workpiece support, and an RF applicator adjacent the reactor enclosure portion, the RF applicator comprising inductive elements and being adapted to couple power from a power source into the reactor chamber;
(b) irradiating a process gas within the reactor chamber with an energy emission from the RF applicator so as to produce an irradiated gas;
(c) varying the energy emission over time;
wherein the energy emission is varied over time using a first modulating signal comprising a first on-time region and a first off-time region;
wherein modulating the energy emission comprises adjusting a duration of at least one of:
(a) the first on-time region;
(b) the first off-time region;
wherein modulating the energy emission further comprises modulating at least one of: the power source, a current of the RF applicator, a rate of change of the current from the RF applicator; and
wherein modulating further comprises modulating the power source and adjusting a power level of the power source such that an average power of the power source is constant.

54. The invention as set forth in claim 53, wherein the energy emission is zero during a greater part of the off-time duration.

55. The invention as set forth in claim 53, wherein the energy emission during the off-time duration is greater than zero and less than the energy emission during the on-time duration.

56. The invention as set forth in claim 53, wherein the irradiated gas is a plasma.

57. The invention as set forth in claim 56, further comprising keeping plasma density approximately constant while modulating the energy emission.

58. The invention as set forth in claim 53, wherein the inductive elements are spatially distributed so as to compensate for a null in a radiation pattern of the RF applicator.

59. The invention as set forth in claim 58, wherein the RF applicator comprises a solenoid non-planar inductive antenna.

60. The invention as set forth in claim 59, wherein the inductive elements comprises a vertical stack of conductive windings.

61. The invention as set forth in claim 60, wherein the non-planar inductive antenna has an axis of symmetry and the windings are at a minimum radial distance from the axis of symmetry.

62. The invention as set forth in claim 61, further comprising:
a second inductive antenna adjacent the reactor enclosure portion at an outer radial location relative to the solenoid antenna.

63. The invention as set forth in claim 60, wherein the windings are at a radial location corresponding to a substantial fraction of a radius of the reactor chamber.

64. The invention as set forth in claim 60, wherein the vertical stack of conductive windings has a right cylindrical shape.

65. The invention as set forth in claim 60, wherein the vertical stack of conductive windings has an upright conical shape.

66. The invention as set forth in claim 60, wherein said vertical stack of conductive windings has an inverted conical shape.

67. The invention as set forth in claim 60, further comprising a planar coil conductor extending radially outward from a bottom winding of the vertical stack of conductive windings.

68. The invention as set forth in claim 67, wherein said vertical stack of conductive windings has an upright conical shape.

69. The invention as set forth in claim 67, wherein the vertical stack of conductive windings has an inverted conical shape.

70. The invention as set forth in claim 59, further comprising:
a second power source coupled to a second inductive antenna.

71. The invention as set forth in claim 70, where the second inductive antenna comprises a second non-planar inductive antenna.

72. The invention as set forth in claim 71, wherein the second non-planar inductive antenna comprises a solenoid antenna.

73. The invention as set forth in claim 59, wherein the solenoid antenna comprises a doubly-wound solenoid winding.

74. The invention as set forth in claim 73, wherein said doubly wound solenoid winding comprises a pair of concentric single solenoid windings.

75. The invention as set forth in claim 73, wherein said doubly wound solenoid winding comprises a vertical stack of at least nearly planar pairs of windings.

76. The invention as set forth in claim 73, further comprising:
a second solenoidal winding adjacent the reactor enclosure portion at an outer radial location relative to the doubly wound solenoid winding.

77. The invention as set forth in claim 76, further comprising:
a second power source coupled to the second solenoid winding.

78. The invention as set forth in claim 76, wherein the second solenoid winding comprises a doubly wound solenoid winding.

79. The invention as set forth in claim 53, wherein the power source comprises a RF power supply coupled to the inductive elements.

80. The invention as set forth in claim 53, wherein the inductive elements have a non-conformal shape and are non-planar with a pitch away from the support plane exceeding that of the reactor enclosure portion.

81. The invention as set forth in claim 80, wherein:
the reactor enclosure portion comprises a ceiling of the reactor chamber overlying the workpiece support; and
the non-conformal shape of the non-planar inductive antenna has a vertical pitch exceeding a vertical pitch of the ceiling.

82. The invention as set forth in claim 81, wherein the ceiling has a shape comprising one of: (a) planar; (b) dome; (c) conical; (d) truncated conical.

83. The invention as set forth in claim 53, wherein the inductive elements and the workpiece support are separated by a distance on the order of a skin depth in the plasma of an induction field of the inductive elements.

84. The invention as set forth in claim 53, further comprising:
providing a plasma reactor further comprising a bias source across the workpiece support, the bias source forming an electric field near the workpiece support; and
modulating the electric field with a second modulating signal.

85. The invention as set forth in claim 84, wherein the second modulating signal comprises a second on-time region and a second off-time region.

86. The invention as set forth in claim 85, wherein modulating the electric field comprises adjusting a duration of at least one of: (a) the second on-time region; (b) the second off-time region.

87. The invention as set forth in claim 86, further comprising:
an irradiated gas that is a plasma and contains species; and
synchronizing the first modulating signal and the second modulating signal such that:
the first off-time region and the second on-time region occur when the plasma is at its substantially coolest temperature; and
the first on-time region and the second off-time region occur when the plasma is at its substantially hottest temperature.

88. The invention of claim 87, further comprising:
keeping plasma density approximately constant while modulating the energy emission and the electric field.

89. The invention as set forth in claim 86, wherein modulating the electric field further comprises modulating at least one of: (a) a power of the bias source; (b) a voltage of the bias source; (c) a current of the bias source; (d) a rate of change of the current of the bias source.

90. A method of processing a workpiece, comprising:
(a) providing a plasma reactor comprising a reactor chamber having an interior surface and reactor walls, a workpiece support for holding the workpiece, a ceiling overlying the workpiece support and adjacent the reactor walls and an RF applicator adapted to couple power from a power source into the reactor chamber;
(b) irradiating a process gas within the reactor chamber with an energy emission from the RF applicator to generate a plasma containing species;
(c) modulating the power output by said power source to said RF applicator with a modulating signal so as to control the density of the species generated;
(d) wherein the modulating signal comprises an on-time region and an off-time region, said on-time and off-time regions corresponding to a duty cycle;
(e) adjusting said duty cycle and performing a corresponding adjustment of a power level of said power source such that an average power of the power source is constant.

* * * * *